(12) United States Patent
Kim et al.

(10) Patent No.: US 12,069,892 B2
(45) Date of Patent: Aug. 20, 2024

(54) DISPLAY APPARATUS WITH BRIDGE ELECTRODE THAT VARIES IN THICKNESS

(71) Applicant: Samsung Display Co., Ltd., Yongin-si (KR)

(72) Inventors: Jeongkuk Kim, Yongin-si (KR); Youngmin Moon, Yongin-si (KR); Kyuhwan Hwang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 407 days.

(21) Appl. No.: 16/930,944

(22) Filed: Jul. 16, 2020

(65) Prior Publication Data
US 2021/0126069 A1    Apr. 29, 2021

(30) Foreign Application Priority Data
Oct. 23, 2019  (KR) .......................... 10-2019-0132383

(51) Int. Cl.
*H10K 59/121*    (2023.01)
*H10K 59/123*    (2023.01)
*H10K 59/124*    (2023.01)
*H10K 59/131*    (2023.01)

(52) U.S. Cl.
CPC ....... *H10K 59/1213* (2023.02); *H10K 59/123* (2023.02); *H10K 59/124* (2023.02); *H10K 59/131* (2023.02)

(58) Field of Classification Search
CPC ............. H01L 27/3262; H01L 27/3248; H01L 27/3276
USPC ............................................................ 257/40
See application file for complete search history.

(56) References Cited

U.S. PATENT DOCUMENTS

| | | | |
|---|---|---|---|
| 7,728,514 B2 | 6/2010 | Rogojevic et al. |
| 9,093,669 B2 | 7/2015 | Park et al. |
| 9,627,645 B2 | 4/2017 | Cui et al. |
| 9,911,941 B2 | 3/2018 | Choi et al. |
| 10,084,150 B1 | 9/2018 | Lou |
| 10,151,041 B2 | 12/2018 | Han |

(Continued)

FOREIGN PATENT DOCUMENTS

| | | |
|---|---|---|
| KR | 10-2014-0085979 | 7/2014 |
| KR | 10-2016-0117798 | 10/2016 |

(Continued)

*Primary Examiner* — Xia L Cross
(74) *Attorney, Agent, or Firm* — KILE PARK REED & HOUTTEMAN PLLC

(57) ABSTRACT

A display apparatus includes a substrate, a first display area, a first pixel area, a second pixel area spaced apart from the first pixel area, and a transmission area, and a second display area, a first pixel on the first pixel area including a first pixel electrode, a first opposite electrode, and a first intermediate layer between the first pixel electrode and the first opposite electrode, a second pixel on the second pixel area and including a second pixel electrode, a second opposite electrode, and a second intermediate layer between the second pixel electrode and the second opposite electrode, and a bridge electrode electrically connecting the first opposite electrode to the second opposite electrode, a thickness of the bridge electrode varies in a direction from one of the first opposite electrode and the second opposite electrode toward the other one of the first opposite electrode and the second opposite electrode.

17 Claims, 18 Drawing Sheets

(56) References Cited

U.S. PATENT DOCUMENTS

| | | |
|---|---|---|
| 10,964,889 B2 | 3/2021 | Jeong |
| 2013/0187163 A1* | 7/2013 | Kim .................... H10K 59/122 |
| | | 438/34 |
| 2016/0285029 A1* | 9/2016 | Jeon ....................... H10K 50/84 |
| 2016/0322595 A1* | 11/2016 | Choi ................... H01L 27/3216 |
| 2020/0312832 A1* | 10/2020 | Chi .................... H01L 27/3218 |

FOREIGN PATENT DOCUMENTS

| | | |
|---|---|---|
| KR | 10-2016-0130042 | 11/2016 |
| KR | 10-2017-0024182 | 3/2017 |
| KR | 10-2018-0032717 | 4/2018 |

\* cited by examiner

---▶ DEPOSITION MATERIAL

DISPLAY APPARATUS WITH BRIDGE ELECTRODE THAT VARIES IN THICKNESS

CROSS-REFERENCE TO RELATED APPLICATIONS

This application claims priority to and benefits of Korean Patent Application No. 10-2019-0132383 under 35 U.S.C. § 119, filed on Oct. 23, 2019, in the Korean Intellectual Property Office, the entire contents of which are incorporated herein by reference.

BACKGROUND

1. Technical Field

One or more embodiments relate to apparatuses and methods, and to a display apparatus and an apparatus and method of manufacturing the display apparatus.

2. Description of Related Art

Display apparatuses continue to be used for various purposes. As display apparatuses have become thinner and lighter, their range of use has widened.

Since display apparatuses are being used in various ways, various methods may be used to design the shapes of display apparatuses, and further, more and more functions may be combined or associated with display apparatuses.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments include a display apparatus including a sensor area in which a sensor or the like may be disposed inside a display area and an apparatus and method of manufacturing the display apparatus, as a method of increasing functions that may be combined or associated with display apparatuses. However, these problems are merely examples and the scope of the disclosure is not limited thereto.

Additional aspects will be set forth in part in the description which follows and, in part, will be apparent from the description, or may be learned by practice of the presented embodiments.

According to one or more embodiments, a display apparatus may include a substrate including a first display area including a first pixel area, a second pixel area spaced apart from the first pixel area, and a transmission area, and a second display area adjacent to the first display area, a first pixel disposed on the first pixel area and including a first pixel electrode, a first opposite electrode, and a first intermediate layer disposed between the first pixel electrode and the first opposite electrode, a second pixel disposed on the second pixel area and including a second pixel electrode, a second opposite electrode, and a second intermediate layer disposed between the second pixel electrode and the second opposite electrode, and a bridge electrode electrically connecting the first opposite electrode to the second opposite electrode, wherein a thickness of the bridge electrode may vary in a direction from one of the first opposite electrode and the second opposite electrode toward the other one of the first opposite electrode and the second opposite electrode.

In an embodiment, a thickness of a portion of the bridge electrode may be larger than a thickness of another portion of the bridge electrode.

In an embodiment, the display apparatus may further include a pixel definition layer disposed on the first pixel electrode and the second pixel electrode and including a first opening and a second opening each exposing a center portion of each of the first pixel electrode and the second pixel electrode, wherein the bridge electrode may be disposed on the pixel definition layer.

In an embodiment, a thickness of a thickest portion of the bridge electrode may be substantially equal to the greater of a thickness of the first opposite electrode or a thickness of the second opposite electrode.

In an embodiment, the thickness of the bridge electrode may decrease gradually from a thickest portion of the bridge electrode to a thinnest portion of the bridge electrode.

In an embodiment, the first display area and the second display area may have different light transmittances.

In an embodiment, a resolution of an image in the first display area may be lower than a resolution of an image in the second display area.

In an embodiment, the display apparatus may further include a component disposed in the first display area.

In an embodiment, the first opposite electrode, the second opposite electrode, and the bridge electrode may be integral with each other.

In an embodiment, the transmission area may be disposed between the first opposite electrode, the second opposite electrode, and the bridge electrode.

According to one or more embodiments, a display apparatus may include a substrate including a first display area including a plurality of pixel areas spaced apart from each other and a transmission area, and a second display area adjacent to the first display area, a pixel disposed on each of the plurality of pixel areas and including a pixel electrode, an opposite electrode, and an intermediate layer disposed between the pixel electrode and the opposite electrode of each of the plurality of pixels, and a bridge electrode electrically connecting the opposite electrodes of the plurality of pixels disposed in two pixel areas among the plurality of pixel areas spaced apart from each other, wherein a thickness of the bridge electrode may vary between the opposite electrodes electrically connected to each other by the bridge electrode.

In an embodiment, a thickest portion of the bridge electrode may be disposed between the opposite electrodes electrically connected to each other by the bridge electrode.

In an embodiment, each of the opposite electrodes may be integral with the bridge electrode.

In an embodiment, the bridge electrode may electrically connect adjacent opposite electrodes among the opposite electrodes of the plurality of pixels.

In an embodiment, the display apparatus may further include a component disposed in the first display area.

In an embodiment, the first display area and the second display area may have different light transmittances.

According to one or more embodiments, an apparatus for manufacturing a display apparatus may include a chamber in which a display substrate may be disposed, a deposition source disposed in the chamber and supplying a deposition material to the display substrate, and a mask assembly disposed in the chamber and disposed between the deposition source and the display substrate, wherein the mask assembly may include a mask frame, and a mask sheet disposed at the mask frame and including a plurality of first opening portions through which the deposition material passes and at least one second opening portion disposed between two first opening portions among the plurality of first opening portions. The at least one second opening portion may have a different area than the first opening portions.

In an embodiment, the at least one second opening portion may include a plurality of second opening portions, and the plurality of second opening portions may be linearly disposed between the two first opening portions.

In an embodiment, the at least one second opening portion may include a plurality of second opening portions, and at least two of the plurality of second opening portions may have different areas.

In an embodiment, the plurality of first opening portions may have areas larger than an area of the at least one second opening portion.

In an embodiment, the plurality of first opening portions may be tetragonal and the at least one second opening portion may be circular.

In an embodiment, the at least one second opening portion may include a plurality of second opening portions, and the plurality of second opening portions may be linearly disposed between edges of the first opening portions that may be adjacent to and face each other.

In an embodiment, the at least one second opening portion may include a plurality of second opening portions, the mask sheet has a portion disposed between adjacent ones of the plurality of second opening portions wherein a thickness of a portion of the mask sheet may be less than a thickness of another portion of the mask sheet.

According to one or more embodiments, a method of manufacturing a display apparatus may include disposing a display substrate and a mask assembly in a chamber, aligning positions of the display substrate and the mask assembly, and forming, in a first display area of the display substrate, a plurality of opposite electrodes corresponding to a plurality of pixel areas spaced apart from each other, and forming a bridge electrode that electrically connects two opposite electrodes among the plurality of opposite electrodes.

In an embodiment, the forming the bridge electrode may include forming a varied thickness of the bridge electrode between the opposite electrodes electrically connected to each other.

In an embodiment, the forming the bridge electrode may include forming a thickest portion of the bridge electrode between the opposite electrodes electrically connected to each other.

In an embodiment, the method may further include forming another opposite electrode in a second display area of the display substrate when forming the plurality of opposite electrodes and the bridge electrode in the first display area.

In an embodiment, the forming the plurality of opposite electrodes and the forming the bridge electrode may include forming each of the plurality of opposite electrodes integrally with the bridge electrode.

In an embodiment, the first display area and the second display area may have different light transmittances.

In an embodiment, the method may further include disposing a component in the first display area.

Other aspects, features, and advantages other than those described above will become apparent from the accompanying drawings, the appended claims, and the detailed description of the disclosure.

These general embodiments may be implemented by using a system, a method, a computer program, or any combination of the system, the method, and the computer program.

BRIEF DESCRIPTION OF THE DRAWINGS

The above and other aspects, features, and advantages of embodiments will be more apparent from the following description taken in conjunction with the accompanying drawings, in which.

DETAILED DESCRIPTION OF THE EMBODIMENTS

Figure 1:
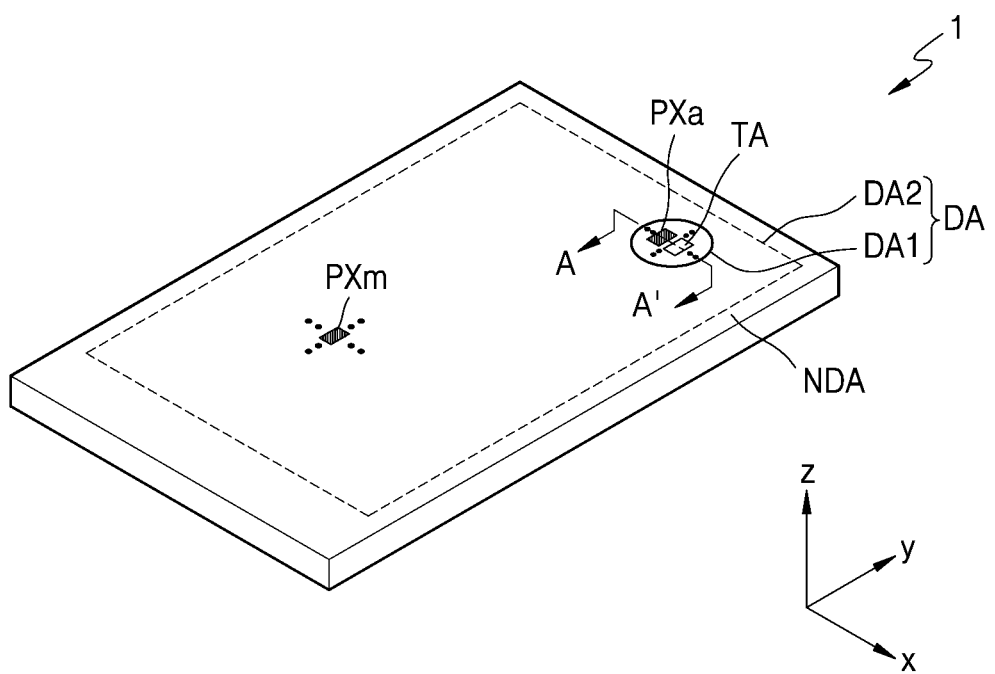
FIG. 1 is a perspective view illustrating a display apparatus according to an embodiment.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, the embodiments are merely described below, by referring to the figures, to explain aspects of the disclosure.

Hereinafter, embodiments will be described in detail with reference to the accompanying drawings, and in the following description, like reference numerals will denote like elements and redundant descriptions thereof may be omitted.

Some of the parts which are not associated with the description may not be provided in order to describe embodiments of the disclosure and like reference numerals refer to like elements throughout the specification.

When a layer, film, region, substrate, or area, is referred to as being "on" another layer, film, region, substrate, or area, it may be directly on the other film, region, substrate, or area, or intervening films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

It will be understood that although terms such as "first" and "second" may be used herein to describe various components, these components should not be limited by these terms and these terms are only used to distinguish one component from another component.

As used herein, the singular forms "a," "an," and "the" are intended to include the plural forms as well, unless the context clearly indicates otherwise.

In the drawings, sizes and thicknesses of elements may be enlarged for better understanding, clarity, and ease of description thereof. However, the disclosure is not limited to the illustrated sizes and thicknesses. In the drawings, the thicknesses of layers, films, panels, regions, and other elements, may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a schematic cross-sectional view" means when a schematic cross-section taken by vertically cutting an object portion is viewed from the side.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

In the following embodiments, the x-axis, the y-axis, and the z-axis are not limited to three axes of the rectangular coordinate system, and may be interpreted in a broader sense. For example, the x axis, the y axis, and the z axis may be perpendicular to each other, or may represent different directions that are not perpendicular to each other.

When an embodiment may be implemented differently, a particular process order may be performed differently from the described order. For example, two consecutively described processes may be performed substantially at the same time or performed in an order opposite to the described order.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a perspective view illustrating a display apparatus according to an embodiment.

Referring to FIG. 1, a display apparatus 1 may include a display area DA that may display an image or images and a non-display area NDA that may not display an image or images. The display area DA may include a second display area DA2 and a first display area DA1 located or disposed in the second display area DA2. The display apparatus 1 may provide a main image by using the light emitted from main pixels PXm arranged or disposed in the second display area DA2.

The display apparatus 1 may include the first display area DA1 in the second display area DA2. As described below with reference to FIG. 2, the first display area DA1 may be an area under or below which a component such as a sensor using infrared light, visible light, sound, or the like may be arranged or disposed.

The first display area DA1 may include a transmission area TA through which the light and/or sound output from the component to the outside or propagating from the outside toward the component may be transmitted. In an embodiment, when infrared light is transmitted through the first display area DA1, the light transmittance thereof may be about 10% or more, for example, about 20% or more, about 25% or more, about 50% or more, or about 85% or more, or about 90% or more. In this case, the light transmittance of the first display area DA1 may be different from the light transmittance of the second display area DA2. For example, the light transmittance of the first display area DA1 may be higher than the light transmittance of the second display area DA2.

In an embodiment, subpixels PXa may be arranged or disposed in the first display area DA1 and may provide an image by using the light emitted from the subpixels PXa. An image provided in the first display area DA1 may be a subimage and may have a lower resolution than an image provided in the second display area DA2. For example, the first display area DA1 may include the transmission area TA through which light and/or sound may pass, wherein the number of subpixels PXa arranged or disposed per unit area in the first display area DA1 may be less than the number of main pixels PXm arranged or disposed per unit area in the second display area DA2.

The first display area DA1 may be at least partially surrounded by the second display area DA2, and in an embodiment, FIG. 1 illustrates that the first display area DA1 may be entirely surrounded by the second display area DA2.

Hereinafter, an organic light emitting display apparatus will be described as an example of the display apparatus 1 according to an embodiment; however, the display apparatus of the disclosure is not limited thereto. In an embodiment, various types of display apparatuses such as inorganic displays (inorganic light emitting displays) and quantum dot light emitting displays may be implemented within the spirit and the scope of the disclosure.

Although FIG. 1 illustrates that the first display area DA1 may be arranged or disposed at one side (upper right side) of the second display area DA2 having a tetragonal shape, the disclosure is not limited thereto. The shape of the second display area DA2 may be a circle, an ellipse, or a polygon such as a triangle or a pentagon, and the position and number of first display areas DA1 may also be variously modified within the spirit and the scope of the disclosure.

Figure 2:
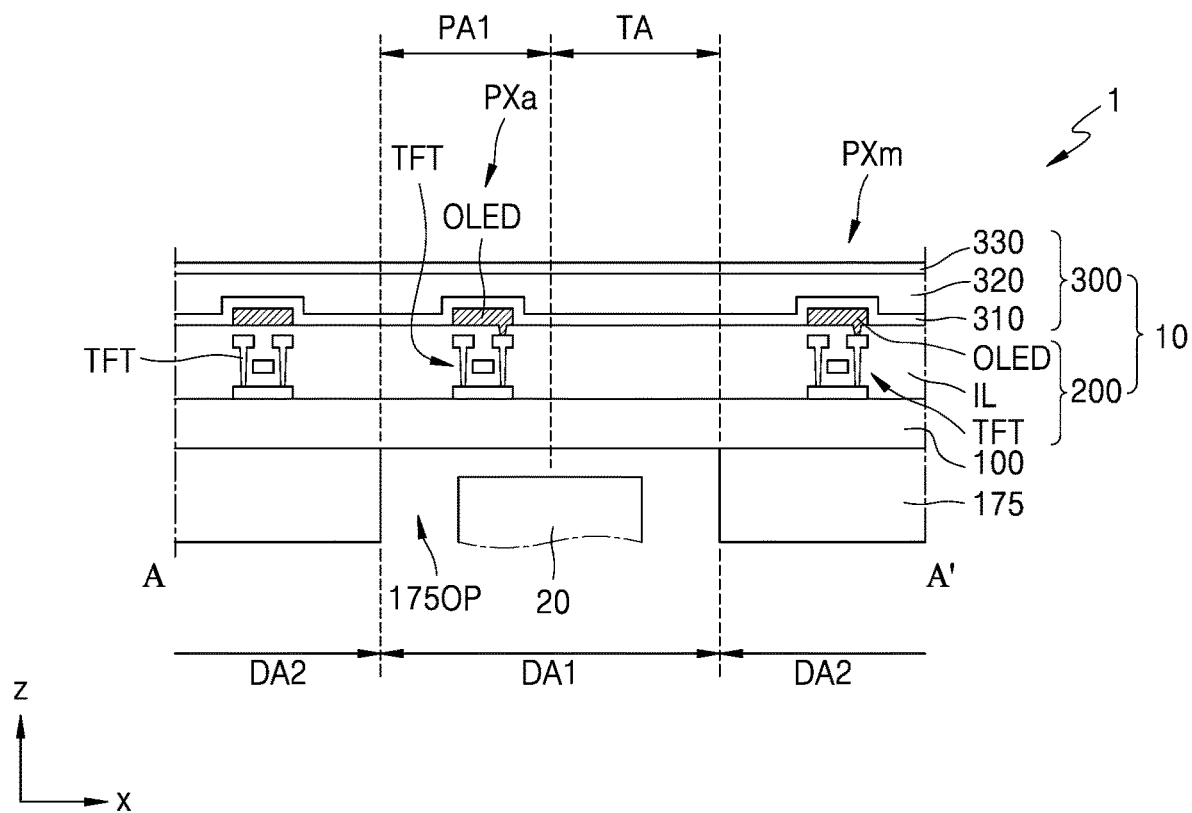
FIG. 2 is a schematic cross-sectional view illustrating a display apparatus according to an embodiment.

FIG. 2 is a schematic cross-sectional view illustrating a display apparatus according to an embodiment. FIG. 2 may correspond to a schematic cross-section taken along line A-A' of FIG. 1.

Referring to FIG. 2, the display apparatus 1 may include a display panel 10 including a display element and a component 20 located or disposed under the display panel 10 and corresponding to the first display area DA1.

The display panel 10 may include a substrate 100, a display element layer 200 arranged or disposed on the substrate 100, and a thin film encapsulation layer 300 as a sealing member for sealing the display element layer 200. The display panel 10 may include a lower protection film 175 arranged or disposed under the substrate 100.

The substrate 100 may include glass or polymer resin. The polymer resin may include polyethersulfone, polyacrylate, polyetherimide, polyethylene naphthalate, polyethylene terephthalate, polyphenylene sulfide, polyarylate, polyimide, polycarbonate, cellulose acetate propionate, or other polymer resin within the spirit and the scope of the disclosure. The substrate 100 including the polymer resin may be flexible, rollable, or bendable. The substrate 100 may have a multilayer structure including an inorganic layer (not illustrated) and/or a layer including the above polymer resin.

The display element layer 200 may include a circuit layer including a thin film transistor TFT, an organic light emitting diode OLED as a display element, and an insulating layer IL therebetween.

A main pixel PXm including a thin film transistor TFT and an organic light emitting diode OLED electrically connected thereto may be arranged or disposed in the second display area DA2, a subpixel PXa including a thin film transistor TFT and an organic light emitting diode OLED electrically connected thereto may be arranged or disposed in the first display area DA1, and lines or wires (not illustrated) may be electrically connected to the main pixel PXm and the subpixel PXa.

A transmission area TA in which a thin film transistor TFT and a pixel may not be arranged or disposed may be arranged or disposed in the first display area DA1. The transmission area TA may be understood as an area through which the light/signal output from the component 20 or the light/signal input to the component 20 may be transmitted.

The component 20 may be located or disposed in the first display area DA1. The component 20 may include an electronic element using light or sound. For example, the component 20 may include a sensor such as an infrared sensor for receiving and using light, a sensor for outputting and detecting light or sound to measure a distance or recognize a fingerprint or touch or the like, a miniature (or compact) lamp for outputting light, or a speaker for outputting sound. In the case of an electronic element using light, the electronic element may use light of various wavelength bands such as visible light, infrared light, and ultraviolet light. More than one component 20 may be provided or disposed in the first display area DA1. For example, as the component 20, a light emitting device and a light receiving device may be provided or disposed together or in combination in the first display area DA1. Alternatively, a light emitting portion and a light receiving portion may be simultaneously provided or disposed in one component 20.

The thin film encapsulation layer 300 may include at least one inorganic encapsulation layer and at least one organic encapsulation layer. In this regard, FIG. 2 illustrates first and second inorganic encapsulation layers 310 and 330 and an organic encapsulation layer 320 therebetween.

The first and second inorganic encapsulation layers 310 and 330 may include one or more inorganic materials such as aluminum oxide, titanium oxide, tantalum oxide, hafnium oxide, zinc oxide, silicon oxide, silicon nitride, or silicon oxynitride. The organic encapsulation layer 320 may include a polymer-based material. The polymer-based material may include polyethyleneterephthalate, polyethylenenaphthalate, polycarbonate, polyimide, polyethylenesulfonate, polyoxymethylene, polyarylate, hexamethyldisiloxane, acrylic resin (for example, polymethylmethacrylate or polyacrylic acid), or any combination thereof.

The lower protection film 175 may be attached under or below the substrate 100 to support and protect the substrate 100. The lower protection film 175 may include an opening 1750P corresponding to the first display area DA1. Because the lower protection film 175 may include the opening 1750P, the light transmittance of the first display area DA1 may be improved. The lower protection film 175 may include polyethylene terephthalate (PET) or polyimide (PI) or other suitable materials within the spirit and the scope of the disclosure.

The area of the first display area DA1 may be larger than the area where the component 20 may be arranged or disposed. Although FIG. 2 illustrates that the area of the first display area DA1 may be equal (or substantially equal) to the area of the opening 1750P, the area of the opening 1750P provided in the lower protection film 175 may not be equal (or not substantially equal) to the area of the first display area DA1. For example, the area of the opening 1750P may be less than the area of the first display area DA1.

Although not illustrated, components such as an input sensing member for sensing a touch input, an antireflection member including a black matrix and a color filter or a polarizer and a retarder, and a transparent window may be arranged or disposed on the display panel 10.

In an embodiment, the thin film encapsulation layer 300 may be used as an encapsulation member for sealing the display element layer 200; however, the disclosure is not limited thereto. For example, an encapsulation substrate bonded to the substrate 100 by sealant or frit may be used as a member for sealing the display element layer 200. In this case, the encapsulation substrate may include the same or similar material as the substrate 100 described above.

Figure 3:
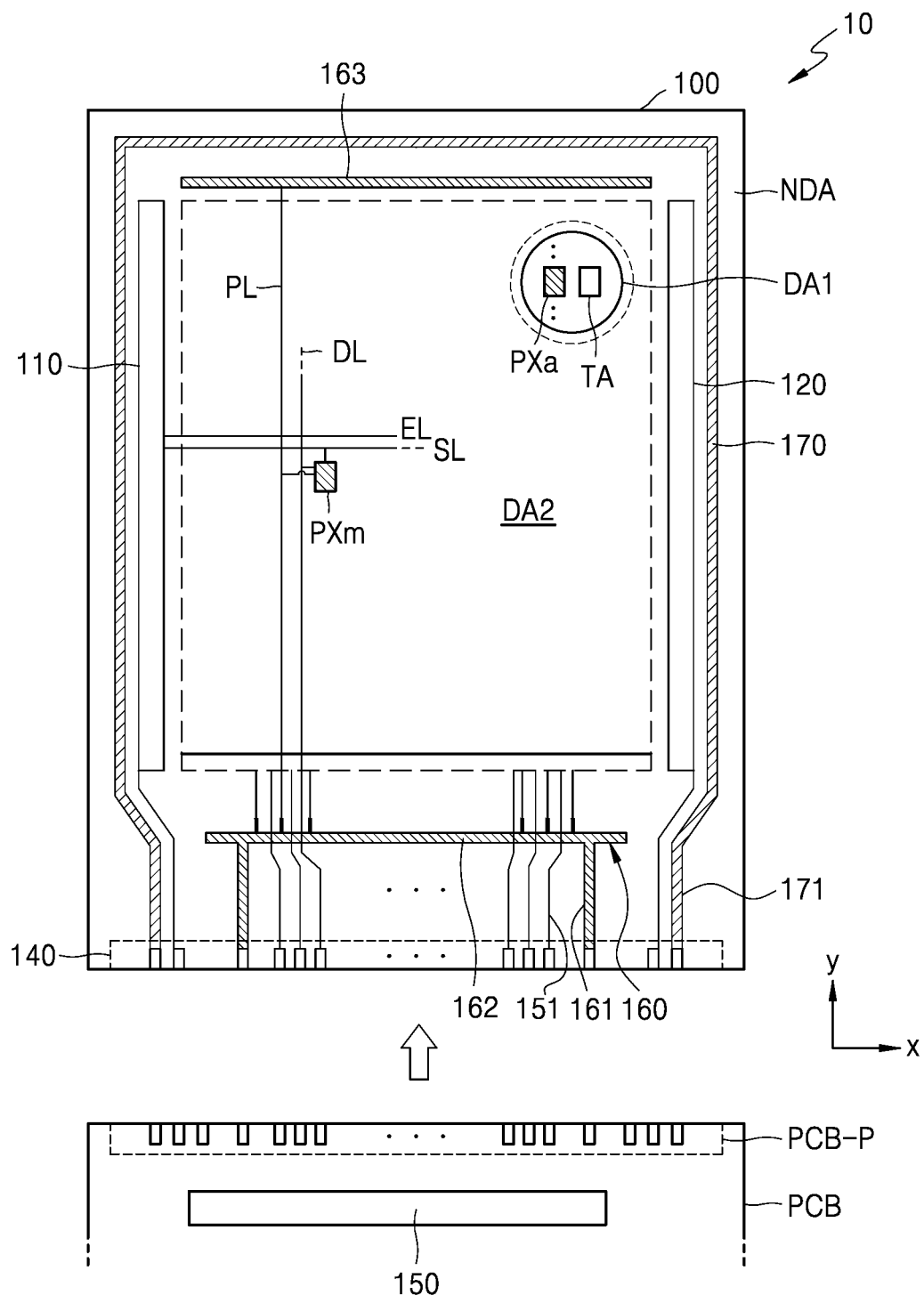
FIG. 3 is a plan view schematically illustrating a display panel according to an embodiment.
Figure 4:
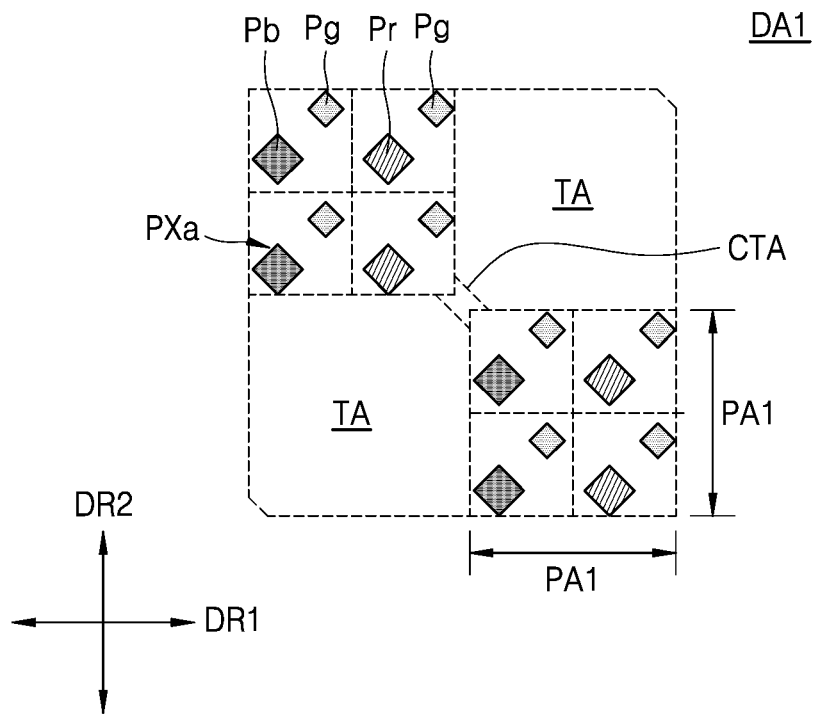
FIG. 4 is an enlarged plan view of an embodiment of a first display area of FIG. 3.

FIG. 3 is a plan view schematically illustrating a display panel according to an embodiment. FIG. 4 is an enlarged plan view of an embodiment of a first display area of FIG. 3.

Referring to FIGS. 3 and 4, various components of the display panel 10 may be arranged or disposed on the substrate 100. The substrate 100 may include a display area and a non-display area NDA surrounding or around the display area. As described above, the display area may include a second display area DA2 in which a main image may be displayed and a first display area DA1 in which a transmission area TA may be included and a subimage may be displayed.

Main pixels PXm may be arranged or disposed in the second display area DA2. The main pixels PXm may each include a display element such as an organic light emitting diode OLED. Each main pixel PXm may emit, for example, red, green, blue, or white light from the organic light emitting diode OLED. Herein, the main pixel PXm may be understood as a pixel emitting any one of red light, green light, blue light, and white light. The second display area DA2 may be protected from external air or moisture by being covered with or overlapped by an encapsulation member (for example, a thin film encapsulation layer or an encapsulation substrate) described above with reference to FIG. 2.

The first display area DA1 may be arranged or disposed inside the second display area DA2, and subpixels PXa may be arranged or disposed in the first display area DA1. The subpixels PXa may each include a display element such as an organic light emitting diode. Each subpixel PXa may emit, for example, red, green, blue, or white light from the organic light emitting diode. Herein, the subpixel PXa may be understood as a pixel emitting any one of red light, green light, blue light, and white light. The first display area DA1 may include the transmission area TA arranged or disposed between the subpixels PXa.

Because the first display area DA1 may include the transmission area TA, the resolution of the first display area DA1 may be lower than the resolution of the second display area DA2. For example, the resolution of the first display area DA1 may be about ½ of the resolution of the second display area DA2. In an embodiment, the resolution of the second display area DA2 may be about 400 ppi or more and the resolution of the first display area DA1 may be about 200 ppi.

The first display area DA1 will be described with reference to FIG. 4.

The first display area DA1 may include a subpixel area PA1 including at least one subpixel PXa, and a transmission area TA or transmission areas. The subpixel area PA1 and the transmission area TA may be alternately arranged or disposed in a first direction DR1 and a second direction DR2 and may be arranged or disposed, for example, in a grid shape.

The subpixel area PA1 may include a subpixel Pr emitting red light, a subpixel Pg emitting green light, and a subpixel Pb emitting blue light. Although FIG. 4 illustrates a pentile-type subpixel PXa, the subpixel PXa may be formed in a stripe shape or in various shapes. Although FIG. 4 illustrates that eight subpixels PXa may be included in the subpixel area PA1, the number of subpixels PXa may be modified according to the resolution of the first display area DA1.

In an embodiment, a pixel circuit of one main pixel PXm and a pixel circuit of one subpixel PXa may have the same shape. However, the disclosure is not limited thereto. The pixel circuit included in the main pixel PXm and the pixel circuit included in the subpixel PXa may be different from each other.

The subpixel PXa may not be arranged or disposed in the transmission area TA. That the subpixel PXa is not arranged or disposed may mean that the subpixel PXa may not include a display element such as an organic light emitting diode OLED. For example, it may be understood that a pixel electrode, an intermediate layer, and an opposite electrode constituting an organic light emitting diode OLED and a pixel circuit electrically connected thereto may not be arranged or disposed in the transmission area TA. Some of signal lines PL, DL, SL, and EL electrically connected to supply a signal to the subpixel PXa in the subpixel area PA1 may be located or disposed across the transmission area TA. However, even in this case, in order to increase the transmittance of the transmission area TA, the signal lines PL, DL, SL, and EL may be arranged or disposed to bypass a center portion of the transmission area TA.

Although not illustrated, a conductive layer (not illustrated) may be arranged or disposed on the substrate 100 to correspond to the subpixel area PA1 of the first display area DA1. The conductive layer may be arranged or disposed under or below the subpixel PXa, for example, between the substrate and the thin film transistor of the subpixel PXa. The conductive layer may block the external light emitted from the component 20 from being input to a pixel circuit PC (see FIG. 5) of the subpixel PXa, thereby preventing the influence thereon. A constant voltage or a signal may be applied to the conductive layer to prevent damage to the pixel circuit PC due to electrostatic discharge. Conductive layers may be provided or disposed in the first display area DA1, and in some cases, the conductive layers may be provided with different voltages.

A connection area CTA may be arranged or disposed between the subpixel areas PA1 described above. A connection electrode (not illustrated) may be arranged or disposed in the connection area CTA to electrically connect the subpixel areas PA1 spaced apart from each other.

Referring back to FIG. 3, each pixel PXm or PXa may be electrically connected to outer circuits arranged or disposed in the non-display area NDA. A first scan driving circuit 110, a second scan driving circuit 120, a terminal 140, a data driving circuit 150, a first power supply line 160, and a second power supply line 170 may be arranged or disposed in the non-display area NDA.

The first scan driving circuit 110 may provide a scan signal to each pixel, for example, the main pixel PXm or the subpixel PXa, through a scan line SL. The first scan driving circuit 110 may provide an emission control signal to each pixel through an emission control line EL. The second scan driving circuit 120 may be arranged or disposed in parallel to the first scan driving circuit 110 with the display area DA therebetween. Some of the pixels, for example, some of the main pixels PXm and subpixels PXa, arranged or disposed in the display area DA may be electrically connected to the first scan driving circuit 110, and the other pixels may be electrically connected to the second scan driving circuit 120. In an embodiment, the second scan driving circuit 120 may be omitted.

A terminal 140 may be arranged or disposed at one side of the substrate 100. The terminal 140 may be exposed, by not being covered by or overlapped by an insulating layer, and be electrically connected to a printed circuit board PCB. A terminal PCB-P of the printed circuit board PCB may be electrically connected to the terminal 140 of the display panel 10. The printed circuit board PCB may transmit power or signals of a controller (not illustrated) to the display panel 10. A control signal generated by the controller may be transmitted to each of the first and second scan driving circuits 110 and 120 through the printed circuit board PCB. The controller may provide first and second power voltages ELVDD and ELVSS to the first and second power supply lines 160 and 170 through first and second connection lines 161 and 171, respectively. The first power voltage ELVDD may be provided to each pixel, for example, the main pixel PXm or the subpixel PXa, through a driving voltage line PL electrically connected to the first power supply line 160, and the second power voltage ELVSS may be provided to an opposite electrode of each pixel PXm or PXa electrically connected to the second power supply line 170.

The data driving circuit 150 may be electrically connected to a data line DL. A data signal of the data driving circuit 150 may be provided to each pixel PXm or PXa through a connection line 151 electrically connected to the terminal 140 and a data line DL electrically connected to the connection line 151. FIG. 3 illustrates that the data driving circuit 150 may be arranged or disposed on a printed circuit board PCB; however, in an embodiment, the data driving circuit 150 may be arranged or disposed on the substrate 100. For example, the data driving circuit 150 may be arranged or disposed between the terminal 140 and the first power supply line 160.

The first power supply line 160 may be arranged or disposed between the second display area DA2 and the terminal 140 and may include a first subline 162 and a second subline 163 extending in parallel in the x direction.

The second power supply line 170 may partially surround the display area DA in a loop shape with a side open.

Figure 5:
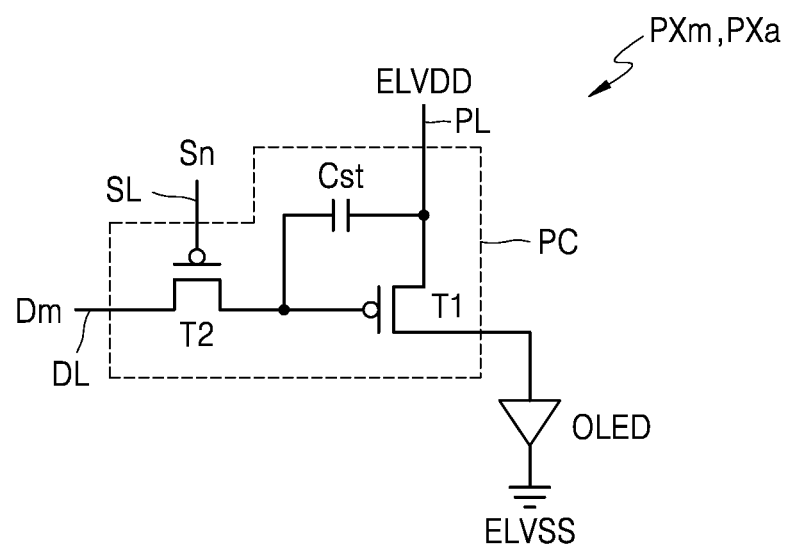
FIGS. 5 and 6 are equivalent circuit diagrams of a main pixel according to an embodiment.
Figure 6:
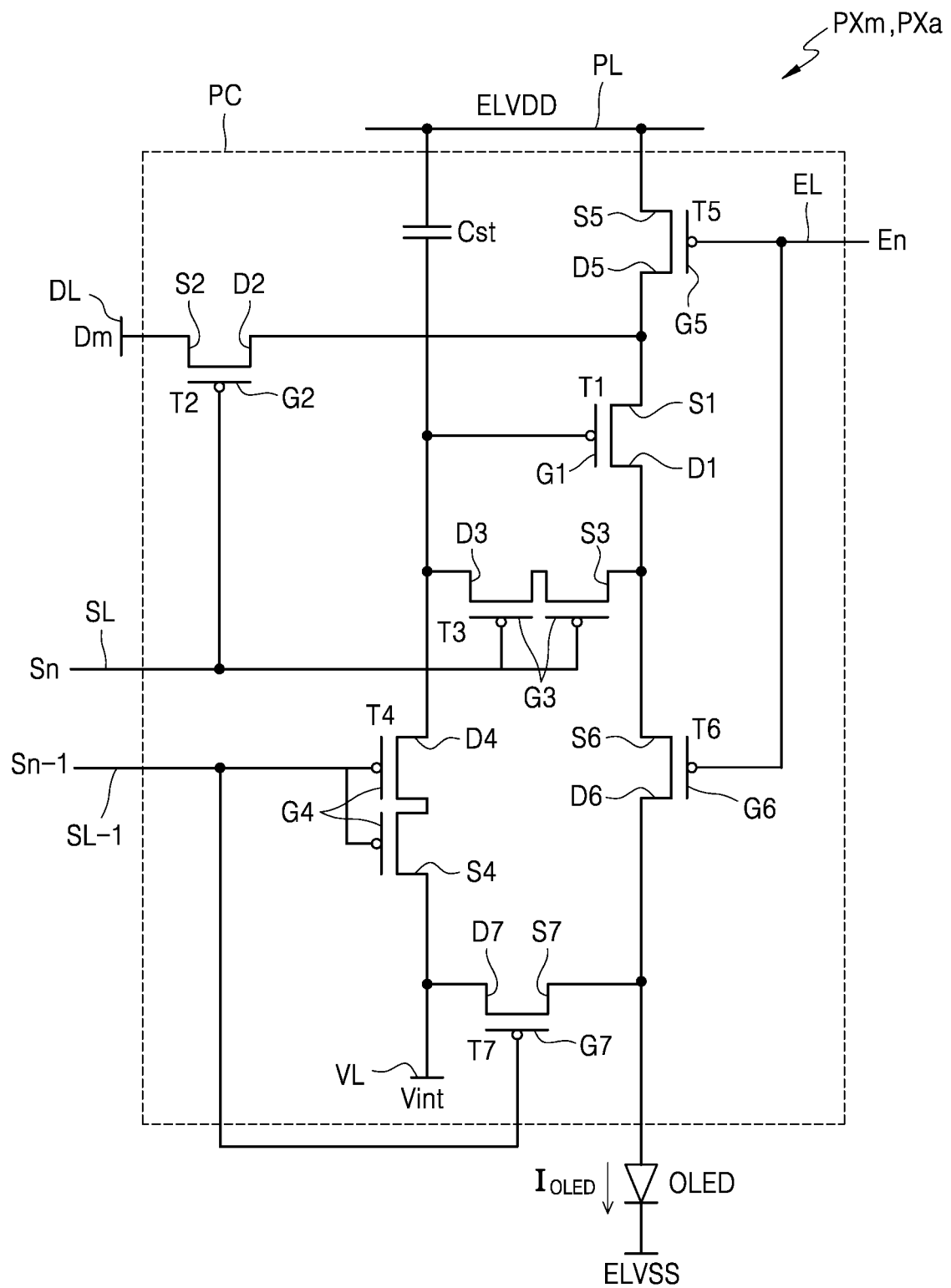

FIGS. 5 and 6 are equivalent circuit diagrams of a main pixel according to an embodiment.

Referring to FIGS. 5 and 6, each pixel PXm or PXa may include a pixel circuit PC electrically connected to a scan line SL and a data line DL and an organic light emitting diode OLED electrically connected to the pixel circuit PC.

The pixel circuit PC may include a driving thin film transistor T1, a switching thin film transistor T2, and a storage capacitor Cst. The switching thin film transistor T2 may be electrically connected to the scan line SL and the data line DL and may transmit a data signal Dm input through the data line DL to the driving thin film transistor T1 according to a scan signal Sn input through the scan line SL.

The storage capacitor Cst may be electrically connected to the switching thin film transistor T2 and the driving voltage line PL and may store a voltage corresponding to a difference between the voltage received from the switching thin film transistor T2 and the first power voltage ELVDD (or driving voltage) supplied to the driving voltage line PL.

The driving thin film transistor T1 may be electrically connected to the driving voltage line PL and the storage capacitor Cst and may control a driving current flowing from the driving voltage line PL through the organic light emitting diode OLED in response to a voltage value stored in the storage capacitor Cst. The organic light emitting diode OLED may emit light with a certain brightness according to the driving current.

Although FIG. 5 illustrates that the pixel circuit PC includes two thin film transistors and one storage capacitor, the disclosure is not limited thereto. As illustrated in FIG. 6, the pixel circuit PC may include seven thin film transistors and one storage capacitor. Although FIG. 6 illustrates that one storage capacitor is included, the pixel circuit PC may include two or more storage capacitors.

Referring to FIG. 6, each pixel PXm or PXa may include a pixel circuit PC and an organic light emitting diode OLED electrically connected to the pixel circuit PC. The pixel circuit PC may include thin film transistors and a storage capacitor. The thin film transistors and the storage capacitor may be electrically connected to signal lines SL, SL−1, EL, and DL, an initialization voltage line VL, and a driving voltage line PL.

Although FIG. 6 illustrates that each pixel PXm or PXa may be electrically connected to the signal lines SL, SL−1, EL, and DL, the initialization voltage line VL, and the driving voltage line PL, the disclosure is not limited thereto. In an embodiment, at least one of the signal lines SL, SL−1, EL, and DL, the initialization voltage line VL, the driving voltage line PL, and/or the like may be shared by adjacent pixels.

The signal lines may include a scan line SL that may transmit a scan signal Sn, a previous scan line SL−1 that may transmit a previous scan signal Sn−1 to a first initialization thin film transistor T4 and a second initialization thin film transistor T7, an emission control line EL that may transmit an emission control signal En to an operation control thin film transistor T5 and an emission control thin film transistor T6, and a data line DL intersecting with the scan line SL and may transmit a data signal Dm. The driving voltage line PL may transmit the driving voltage ELVDD to the driving thin film transistor T1, and the initialization voltage line VL may transmit an initialization voltage Vint for initializing the driving thin film transistor T1 and a pixel electrode of a main organic light emitting diode OLED.

A driving gate electrode G1 of the driving thin film transistor T1 may be electrically connected to a lower electrode CE1 of the storage capacitor Cst, a driving source electrode S1 of the driving thin film transistor T1 may be electrically connected to a lower driving voltage line PL via the operation control thin film transistor T5, and a driving drain electrode D1 of the driving thin film transistor T1 may be electrically connected to the pixel electrode of the main organic light emitting diode OLED via the emission control thin film transistor T6. The driving thin film transistor T1 may receive the data signal Dm according to a switching operation of the switching thin film transistor T2 and supply a driving current IDLED to the main organic light emitting diode OLED.

A switching gate electrode G2 of the switching thin film transistor T2 may be electrically connected to the scan line SL, a switching source electrode S2 of the switching thin film transistor T2 may be electrically connected to the data line DL, and a switching drain electrode D2 of the switching thin film transistor T2 may be electrically connected to the driving source electrode S1 of the driving thin film transistor T1 and electrically connected to the lower driving voltage line PL via the operation control thin film transistor T5. The switching thin film transistor T2 may be turned on according to the scan signal Sn received through the scan line SL, to perform a switching operation of transmitting the data signal Dm transmitted to the data line DL to the source electrode S1 of the driving thin film transistor T1.

A compensation gate electrode G3 of a compensation thin film transistor T3 may be electrically connected to the scan line SL, a compensation source electrode S3 of the compensation thin film transistor T3 may be electrically connected to the driving drain electrode D1 of the driving thin film transistor T1 and electrically connected to the pixel electrode of the main organic light emitting diode OLED via the emission control thin film transistor T6, and a compensation drain electrode D3 of the compensation thin film transistor T3 may be electrically connected to the lower electrode CE1 of the storage capacitor Cst, the first initialization drain electrode D4 of the first initialization thin film transistor T4, and the driving gate electrode G1 of the driving thin film transistor T1. The compensation thin film transistor T3 may be turned on according to the scan signal Sn received through the scan line SL, to electrically connect the driving gate electrode G1 to the driving drain electrode D1 of the driving thin film transistor T1 to diode-connect the driving thin film transistor T1.

A first initialization gate electrode G4 of the first initialization thin film transistor T4 may be electrically connected to the previous scan line SL−1, a first initialization source electrode S4 of the first initialization thin film transistor T4 may be electrically connected to a second initialization drain electrode D7 of the second initialization thin film transistor T7 and the initialization voltage line VL, and a first initialization drain electrode D4 of the first initialization thin film transistor T4 may be electrically connected to the lower electrode CE1 of the storage capacitor Cst, the compensation drain electrode D3 of the compensation thin film transistor T3, and the driving gate electrode G1 of the driving thin film transistor T1. The first initialization thin film transistor T4 may be turned on according to the previous scan signal Sn−1 received through the previous scan line SL−1, to perform an initialization operation of initializing the voltage of the driving gate electrode G1 of the driving thin film transistor T1 by transmitting the initialization voltage Vint to the driving gate electrode G1 of the driving thin film transistor T1.

An operation control gate electrode G5 of the operation control thin film transistor T5 may be electrically connected to the emission control line EL, an operation control source electrode S5 of the operation control thin film transistor T5 may be electrically connected to the lower driving voltage line PL, and an operation control drain electrode D5 of the operation control thin film transistor T5 may be electrically connected to the driving source electrode S1 of the driving thin film transistor T1 and the switching drain electrode D2 of the switching thin film transistor T2.

An emission control gate electrode G6 of the emission control thin film transistor T6 may be electrically connected to the emission control line EL, an emission control source electrode S6 of the emission control thin film transistor T6 may be electrically connected to the driving drain electrode D1 of the driving thin film transistor T1 and the compensation source electrode S3 of the compensation thin film transistor T3, and an emission control drain electrode D6 of the emission control thin film transistor T6 may be electrically connected to a second initialization source electrode S7 of the second initialization thin film transistor T7 and the pixel electrode of the organic light-emitting diode OLED.

The operation control thin film transistor T5 and the emission control thin film transistor T6 may be simultaneously turned on according to the emission control signal En received through the emission control line EL, such that the driving voltage ELVDD may be transmitted to the main organic light emitting diode OLED and thus the driving current IDLED may flow through the organic light emitting diode OLED.

A second initialization gate electrode G7 of the second initialization thin film transistor T7 may be electrically connected to the previous scan line SL−1, the second initialization source electrode S7 of the second initialization thin film transistor T7 may be electrically connected to the emission control drain electrode D6 of the emission control thin film transistor T6 and the pixel electrode of the main organic light emitting diode OLED, and the second initialization drain electrode D7 of the second initialization thin film transistor T7 may be electrically connected to the first initialization source electrode S4 of the first initialization thin film transistor T4 and the initialization voltage line VL. The second initialization thin film transistor T7 may be turned on according to the previous scan signal Sn−1 received through the previous scan line SL−1, to initialize the pixel electrode of the main organic light emitting diode OLED.

Although FIG. 6 illustrates a case where the first initialization thin film transistor T4 and the second initialization thin film transistor T7 may be electrically connected to the previous scan line SL−1, the disclosure is not limited thereto. In an embodiment, the first initialization thin film transistor T4 may be electrically connected to the previous scan line SL−1 to be driven according to the previous scan signal Sn−1, and the second initialization thin film transistor T7 may be electrically connected to a separate signal line (for example, a subsequent scan line) to be driven according to a signal transmitted to the signal line.

An upper electrode CE2 of the storage capacitor Cst may be electrically connected to the driving voltage line PL, and the opposite electrode of the organic light emitting diode OLED may be electrically connected to the common voltage ELVSS. Accordingly, the organic light emitting diode OLED may receive the driving current IDLED from the driving thin film transistor T1 to emit light to display an image.

Although FIG. 6 illustrates that the compensation thin film transistor T3 and the first initialization thin film transistor T4 may have dual gate electrodes, the compensation thin film transistor T3 and the first initialization thin film transistor T4 may have one gate electrode.

Figure 7:
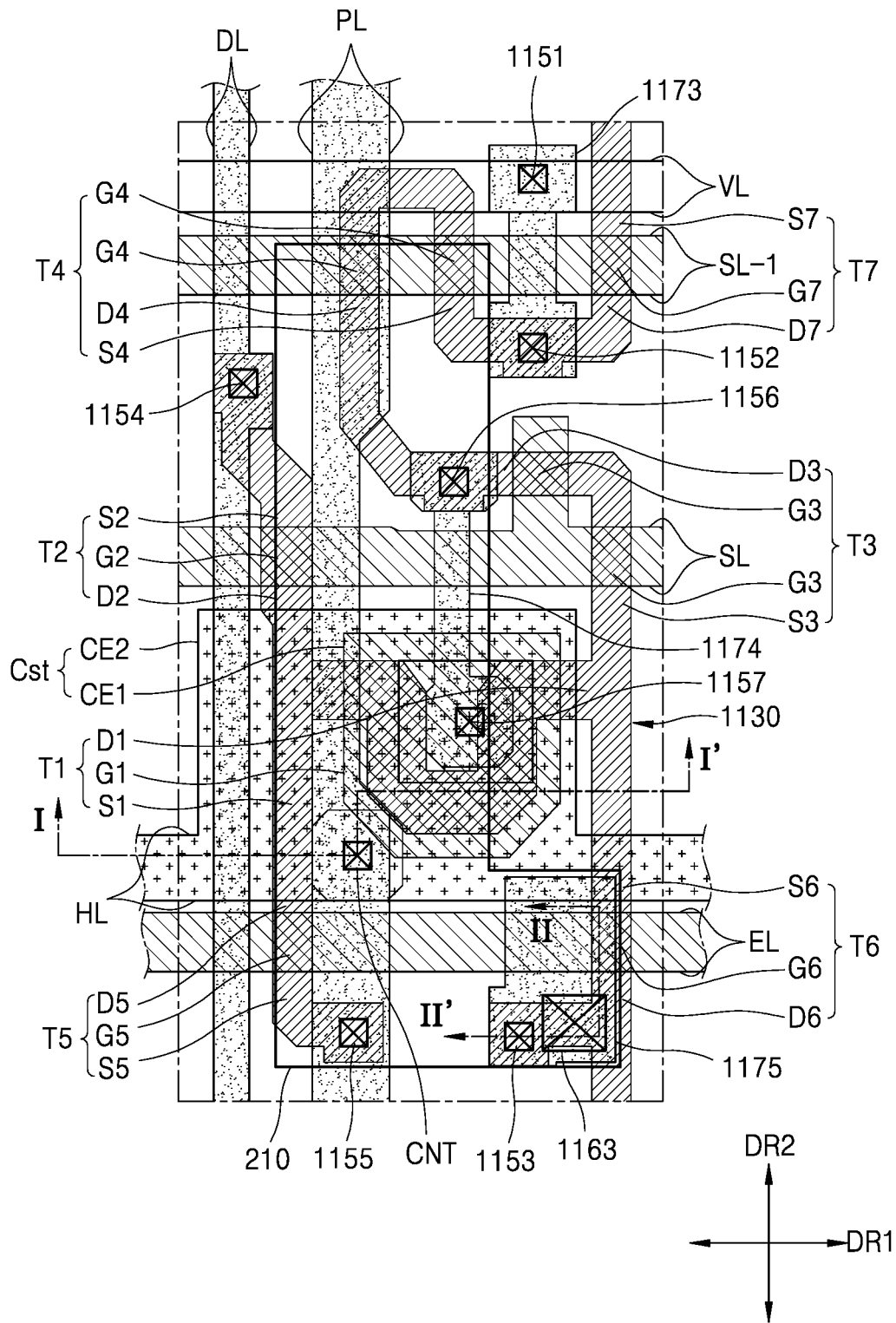
FIG. 7 is an arrangement diagram schematically illustrating a pixel circuit according to an embodiment.
Figure 8:
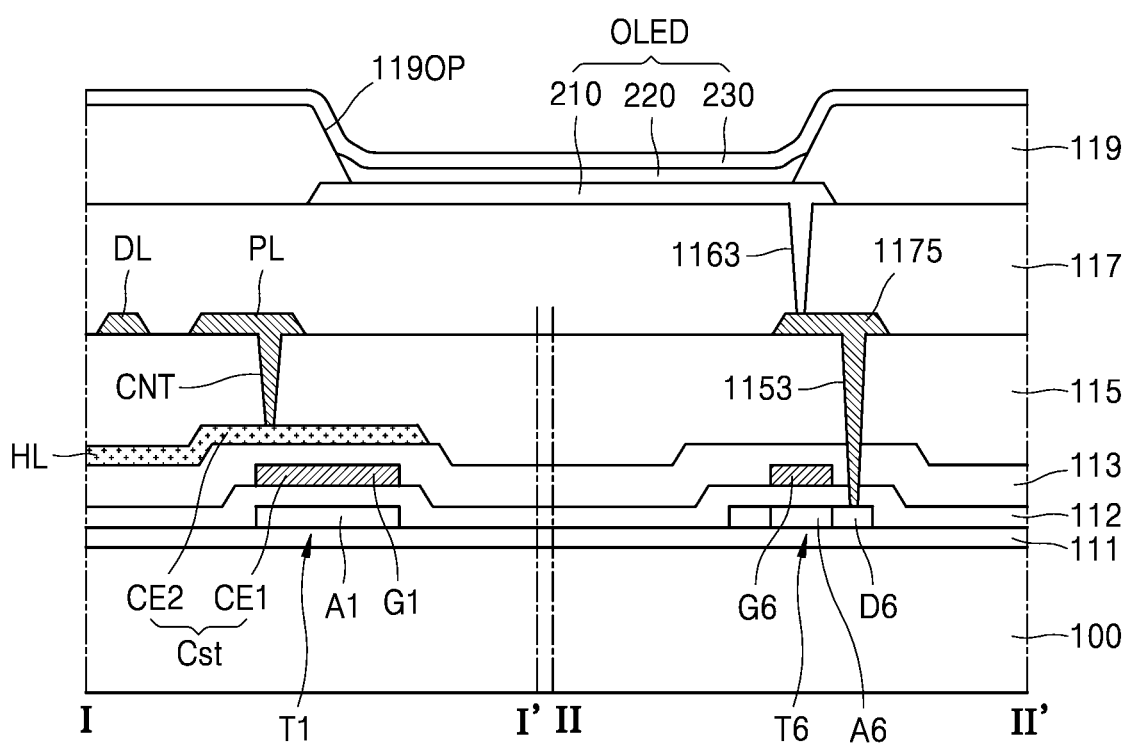
FIG. 8 is a schematic cross-sectional view of the pixel circuit taken along lines I-I' and II-II' of FIG. 7.

FIG. 7 is an arrangement diagram schematically illustrating a pixel circuit according to an embodiment. FIG. 8 is a schematic cross-sectional view of the pixel circuit taken along lines I-I' and II-II' of FIG. 7.

Referring to FIGS. 7 and 8, the driving thin film transistor T1, the switching thin film transistor T2, the compensation thin film transistor T3, the first initialization thin film transistor T4, the operation control thin film transistor T5, and the emission control thin film transistor T6, and the second initialization thin film transistor T7 may be arranged or disposed along a semiconductor layer 1130.

The semiconductor layer 1130 may be arranged or disposed on a substrate where a buffer layer of an inorganic insulating material may be formed. In an embodiment, the semiconductor layer 1130 may include low-temperature polysilicon (LTPS). Because the polysilicon material has high electron mobility (about 10 $cm^2$/Vs or more), low energy consumption, and high reliability, the polysilicon material may be used as a semiconductor layer of a thin film transistor in a display apparatus. However, the disclosure is not limited thereto, and in an embodiment, the semiconductor layer 1130 may be formed of amorphous silicon (a-Si) and/or oxide semiconductor, some semiconductor layers among thin film transistors may be formed of LTPS, and other semiconductor layers may be formed of amorphous silicon (a-Si) and/or oxide semiconductor.

Some areas of the semiconductor layer 1130 may correspond to semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7. In other words, it may be understood that the semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 may be electrically connected to each other and may be bent in various shapes.

The semiconductor layer 1130 may include a channel area and a source area and a drain area on both sides of the channel area, and the source area and the drain area may be understood as the source electrode and the drain electrode of the corresponding thin film transistor. Hereinafter, for convenience, the source area and the drain area may be respectively referred to as a source electrode and a drain electrode.

The driving thin film transistor T1 may include a driving gate electrode G1 overlapping a driving channel area, and a driving source electrode S1 and a driving drain electrode D1 on both sides of the driving channel area. The driving channel area overlapping the driving gate electrode G1 may have a bent shape such as an omega shape, or arch shape, to form a long channel length in a narrow space. When the driving channel area is long, the driving range of a gate voltage may widen and thus the gradation of light emitted from the organic light-emitting diode OLED may be more finely controlled and the display quality thereof may be improved.

The switching thin film transistor T2 may include a switching gate electrode G2 overlapping a switching channel area, and a switching source electrode S2 and a switching drain electrode D2 on both sides of the switching channel area. The switching drain electrode D2 may be electrically connected to the driving source electrode S1.

The compensation thin film transistor T3 may be a dual thin film transistor, may include compensation gate electrodes G3 overlapping two compensation channel areas, and may include a compensation source electrode S3 and a compensation drain electrode D3 arranged or disposed on both sides thereof. The compensation thin film transistor T3 may be electrically connected to the driving gate electrode G1 of the driving thin film transistor T1 through a node connection line 1174 which will be described below.

The first initialization thin film transistor T4 may be a dual thin film transistor, may include a first initialization gate electrode G4 overlapping two first initialization channel areas, and may include a first initialization source electrode S4 and a first initialization drain electrode D4 arranged or disposed on both sides thereof.

The operation control thin film transistor T5 may include an operation control gate electrode G5 overlapping an operation control channel area, and an operation control source electrode S5 and an operation control drain electrode D5 located or disposed at both sides thereof. The operation control drain electrode D5 may be electrically connected to the driving source electrode S1.

The emission control thin film transistor T6 may include an emission control gate electrode G6 overlapping an emission control channel area, and an emission control source electrode S6 and an emission control drain electrode D6 located or disposed at both sides thereof. The emission control source electrode S6 may be electrically connected to the driving drain electrode D1.

The second initialization thin film transistor T7 may include a second initialization gate electrode G7 overlapping a second initialization channel area, and a second initialization source electrode S7 and a second initialization drain electrode D7 located or disposed at both sides thereof.

The thin film transistors described above may be electrically connected to the signal lines SL, SL−1, EL, and DL, the initialization voltage line VL, and the driving voltage line PL.

The scan line SL, the previous scan line SL−1, the emission control line EL, and the driving gate electrode G1 may be arranged or disposed over the semiconductor layer 1130 with one or more insulating layers therebetween.

The scan line SL may extend in the first direction DR1. Some areas of the scan line SL may correspond to the switching and compensation gate electrodes G2 and G3. For example, the areas of the scan line SL overlapping the channel areas of the switching and compensation thin film transistors T2 and T3 may be respectively the switching and compensation gate electrodes G2 and G3.

The previous scan line SL−1 may extend in the first direction DR1, and some areas thereof may respectively correspond to the first and second initialization gate electrodes G4 and G7. For example, the areas of the previous scan line SL−1 overlapping the channel areas of the first and second initialization thin film transistors T4 and T7 may be respectively the first and second initialization gate electrodes G4 and G7.

The emission control line EL may extend in the first direction DR1. Some areas of the emission control line EL may respectively correspond to the operation control and emission control gate electrodes G5 and G6. For example, the areas of the emission control line EL overlapping the channel areas of the operation control and emission control thin film transistors T5 and T6 may be respectively the operation control and emission control gate electrodes G5 and G6.

The driving gate electrode G1 may be a floating electrode and may be electrically connected to the compensation thin film transistor T3 through the node connection line 1174 described above.

An electrode voltage line HL may be arranged or disposed over the scan line SL, the previous scan line SL−1, the emission control line EL, and the driving gate electrode G1 with one or more insulating layers therebetween.

The electrode voltage line HL may extend in the first direction DR1 to intersect with the data line DL and the driving voltage line PL. A portion of the electrode voltage line HL may cover or overlap at least a portion of the driving gate electrode G1 and may form the storage capacitor Cst with the driving gate electrode G1. For example, the driving gate electrode G1 may be the lower electrode CE1 of the storage capacitor Cst and a portion of the electrode voltage line HL may be the upper electrode CE2 of the storage capacitor Cst.

The upper electrode CE2 of the storage capacitor Cst may be electrically connected to the driving voltage line PL. In this regard, the electrode voltage line HL may be electrically connected through a contact hole CNT to the driving voltage line PL arranged or disposed on the electrode voltage line HL. Thus, the electrode voltage line HL may have the same voltage level (constant voltage) as the driving voltage line PL. For example, the electrode voltage line HL may have a constant voltage of about +5 V. The electrode voltage line HL may be understood as a horizontal driving voltage line.

Because the driving voltage line PL extends in the second direction DR2 and the electrode voltage line HL electrically connected to the driving voltage line PL extends in the first direction DR1 intersecting with the second direction DR2, driving voltage lines PL and electrode voltage lines HL may form a mesh structure in a display area.

The data line DL, the driving voltage line PL, an initialization connection line 1173, and the node connection line 1174 may be arranged or disposed over the electrode voltage line HL with one or more insulating layers therebetween.

The data line DL may extend in the second direction DR2 and may be electrically connected to the switching source electrode S2 of the switching thin film transistor T2 through a contact hole 1154. A portion of the data line DL may be understood as a switching source electrode.

The driving voltage line PL may extend in the second direction DR2 and may be electrically connected to the electrode voltage line HL through the contact hole CNT as described above. For example, the driving voltage line PL may be electrically connected to the operation control thin film transistor T5 through a contact hole 1155. The driving voltage line PL may be electrically connected to the operation control drain electrode D5 through the contact hole 1155.

An end of the initialization connection line 1173 may be electrically connected to the first and second initialization thin film transistors T4 and T7 through a contact hole 1152, and another end thereof may be electrically connected to the initialization voltage line VL through a contact hole 1151, which will be described below.

An end of the node connection line 1174 may be electrically connected to the compensation drain electrode D3 through a contact hole 1156, and another end thereof may be electrically connected to the driving gate electrode G1 through a contact hole 1157.

The initialization voltage line VL may be arranged or disposed over the data line DL, the driving voltage line PL, the initialization connection line 1173, and the node connection line 1174 with one or more insulating layers therebetween.

The initialization voltage line VL may extend in the first direction DR1. The initialization voltage line VL may be electrically connected to the first and second initialization thin film transistors T4 and T7 through the initialization connection line 1173. The initialization voltage line VL may have a constant voltage (for example, about −2 V).

The initialization voltage line VL may be arranged or disposed on the same layer and may include the same material as a pixel electrode 210 of the organic light emitting diode OLED (see FIG. 8). The pixel electrode 210 may be electrically connected to the emission control thin film transistor T6. The pixel electrode 210 may be electrically connected to a connection metal 1175 through a contact hole 1163, and the connection metal 1175 may be electrically connected to the emission control drain electrode D6 through a contact hole 1153.

FIG. 7 illustrates that the initialization voltage line VL may be arranged or disposed on the same layer as the pixel electrode 210; however, in an embodiment, the initialization voltage line VL may be arranged or disposed on the same layer as the electrode voltage line HL.

Hereinafter, a stack structure of the components included in the main pixel according to an embodiment will be described with reference to FIG. 8.

The substrate 100 may include glass or polymer resin. The polymer resin may include polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. The substrate 100 may have a multilayer structure including an inorganic layer (not illustrated) and a layer including the above polymer resin.

A buffer layer 111 may be located or disposed on the substrate 100 to reduce or block the penetration of foreign materials, moisture, or external air from the bottom of the substrate 100 and may provide a flat surface on the substrate 100. The buffer layer 111 may include an inorganic material such as oxide or nitride, an organic material, or an organic/inorganic composite and may include a single-layer or multi-layer structure of an inorganic material and an organic material. A barrier layer (not illustrated) for blocking the penetration of external air may be included between the substrate 100 and the buffer layer 111.

Gate electrodes G1 and G6 may be arranged or disposed on semiconductor layers A1 and A6 with a first gate insulating layer 112 therebetween. The gate electrodes G1 and G6 may include molybdenum (Mo), aluminum (Al), copper (Cu), titanium (Ti), or other suitable material within the spirit and the scope of the disclosure and may include a single layer or a multiple layer. For example, the gate electrodes G1 and G6 may include a single Mo layer. The scan line SL (see FIG. 7), the previous scan line SL−1, and the emission control line EL may be formed on the same layer as the gate electrodes G1 and G6. For example, the gate electrodes G1 and G6, the scan line SL (see FIG. 7), the previous scan line SL−1, and the emission control line EL may be arranged or disposed on the first gate insulating layer 112.

The first gate insulating layer 112 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), and hafnium oxide ($HfO_2$), or zinc oxide ($ZnO_2$).

A second gate insulating layer 113 may be provided or disposed to cover or overlap the gate electrodes G1 and G6. The second gate insulating layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), and hafnium oxide ($HfO_2$), or zinc oxide ($ZnO_2$).

The lower electrode CE1 of the storage capacitor Cst may be integrally formed with the driving gate electrode G1 of the driving thin film transistor T1. For example, the driving gate electrode G1 of the driving thin film transistor T1 may function as the lower electrode CE1 of the storage capacitor Cst.

The upper electrode CE2 of the storage capacitor Cst may overlap the lower electrode CE1 with the second gate insulating layer 113 therebetween. In this case, the second gate insulating layer 113 may function as a dielectric layer of the storage capacitor Cst. The upper electrode CE2 may include a conductive material including molybdenum (Mo), aluminum (Al), copper (Cu), titanium (Ti), or the like and may include a single layer or a multiple layer including the above material. For example, the upper electrode CE2 may include a single Mo layer or a multiple layer of Mo/Al/Mo.

Although it is illustrated that the storage capacitor Cst may overlap the driving thin film transistor T1, the disclosure is not limited thereto. The storage capacitor Cst may be variously modified such that the storage capacitor Cst may not overlap the driving thin film transistor T1.

The upper electrode CE2 may function as the electrode voltage line HL. For example, a portion of the electrode voltage line HL may be the upper electrode CE2 of the storage capacitor Cst.

An interlayer insulating layer 115 may be provided or disposed to cover or overlap the upper electrode CE2. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), and hafnium oxide ($HfO_2$), or zinc oxide ($ZnO_2$). In FIG. 8, the interlayer insulating layer 115 may be illustrated as a single layer; however, in an embodiment, the interlayer insulating layer 115 may have a multilayer structure.

The data line DL, the driving voltage line PL, and the connection metal 1175 may be arranged or disposed on the interlayer insulating layer 115. The data line DL, the driving voltage line PL, and the connection metal 1175 may include a conductive material including molybdenum (Mo), aluminum (Al), copper (Cu), titanium (Ti), or the like and may include a single layer or a multiple layer including the above materials. For example, the data line DL, the driving voltage line PL, and the connection metal 1175 may include a multilayer structure of Ti/Al/Ti.

The upper electrode CE2 of the storage capacitor Cst may be electrically connected through the driving voltage line PL and the contact hole CNT defined in the interlayer insulating layer 115. This may mean that the electrode voltage line HL may be electrically connected to the driving voltage line PL through the contact hole CNT. Thus, the electrode voltage line HL may have the same voltage level (constant voltage) as the driving voltage line PL.

The connection metal 1175 may be electrically connected to the semiconductor layer A6 of the emission control thin film transistor T6 through the contact hole 1153 passing through the interlayer insulating layer 115, the second gate insulating layer 113, and the first gate insulating layer 112. The emission control thin film transistor T6 may be electrically connected to the pixel electrode 210 of the organic light emitting diode OLED through the connection metal 1175.

A planarization layer 117 may be arranged or disposed on the data line DL, the driving voltage line PL, and the connection metal 1175, and an organic light emitting diode OLED may be located or disposed on the planarization layer 117.

The planarization layer 117 may have a flat upper surface such that the pixel electrode 210 may be formed flat. The planarization layer 117 may include a single layer or a multiple layer formed of an organic material. The planarization layer 117 may include a general-purpose polymer such as benzocyclobutene (BCB), polyimide, hexamethyldisiloxane (HMDSO), polymethylmethacrylate (PMMA), or polystyrene (PS), a polymer derivative having a phenolic group, an acrylic polymer, an imide-based polymer, an arylether-based polymer, an amide-based polymer, a fluorine-based polymer, a p-xylene-based polymer, a vinyl alcohol-based polymer, or any blend thereof. The planarization layer 117 may include an inorganic material. The planarization layer 117 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), and hafnium oxide ($HfO_2$), or zinc oxide ($ZnO_2$). When the planarization layer 117 includes an inorganic material, chemical planarization polishing may be performed, for example, in some cases. The planarization layer 117 may include both an organic material and an inorganic material.

The pixel electrode 210 may be a (semi)transparent electrode or a reflective electrode. In an embodiment, the pixel electrode 210 may include a reflective layer formed of Ag, Mg, Al, Pt, Pd, Au, Ni, Nd, Ir, Cr, or any compound thereof and a transparent or semitransparent electrode layer formed or disposed on the reflective layer. The transparent or semitransparent electrode layer may include at least one of indium tin oxide (ITO), indium zinc oxide (IZO), zinc oxide (ZnO), indium oxide ($In_2O_3$), indium gallium oxide (IGO), and aluminum zinc oxide (AZO). In an embodiment, the pixel electrode 210 may include a stack structure of ITO/Ag/ITO.

A pixel definition layer 119 may be arranged or disposed on the planarization layer 117, and the pixel definition layer 119 may have an opening portion 1190P exposing a center portion of the pixel electrode 210, thereby defining an emission area of the pixel. For example, the pixel definition layer 119 may increase the distance between the edge of the pixel electrode 210 and an opposite electrode 230 over the pixel electrode 210 to prevent an arc or the like from occurring at an edge of the pixel electrode 210. The pixel definition layer 119 may be formed of an organic insulating material such as polyimide, polyamide, acrylic resin, benzocyclobutene, hexamethyldisiloxane (HMDSO), or phenol resin by spin coating or other process within the spirit and the scope of the disclosure.

An intermediate layer 220 of the organic light emitting diode OLED may include an organic emission layer. The organic emission layer may include an organic material including a fluorescent or phosphorescent material emitting red, green, blue, or white light. The organic emission layer may include a low-molecular weight organic material or a high-molecular weight organic material, and functional layers such as a hole transport layer (HTL), a hole injection layer (HIL), an electron transport layer (ETL), and an electron injection layer (EIL) may optionally be arranged or disposed under or below and over the organic emission layer. The intermediate layer 220 may be arranged or disposed corresponding to each of pixel electrodes 210. However, the disclosure is not limited thereto. The intermediate layer 220 may be modified in various ways such as to include an integral layer over the pixel electrodes 210.

The opposite electrode 230 may be a transparent electrode or a reflective electrode. In an embodiment, the opposite electrode 230 may be a transparent or semitransparent electrode and may include a thin metal layer having a low work function and including Li, Ca, LiF/Ca, LiF/Al, Al, Ag, Mg, or any compound thereof. A transparent conductive oxide (TCO) layer such as ITO, IZO, ZnO, or $In_2O_3$ may be arranged or disposed on the thin metal layer.

When the pixel electrode 210 is a reflective electrode and the opposite electrode 230 is a transparent electrode, the light emitted from the intermediate layer 220 may be emitted toward the opposite electrode 230 such that the display apparatus may be a top-emission type display apparatus. When the pixel electrode 210 is a transparent or semitransparent electrode and the opposite electrode 230 is a reflective electrode, the light emitted from the intermediate layer 220 may be emitted toward the substrate 100 such that the display apparatus may be a bottom-emission type display apparatus. However, the embodiment is not limited thereto. The display apparatus may be a dual emission type display apparatus that may emit light in both directions corresponding to the top side and the bottom side thereof.

In an embodiment, the opposite electrode 230 may be arranged or disposed over the entire surface of the second display area DA2, and a portion of the edge thereof may be located or disposed in the non-display area NDA. The opposite electrode 230 may be integrally formed in the main pixels PXm located or disposed on the second display area DA2, for example, in organic light emitting diodes OLED, to correspond to pixel electrodes 210.

The opposite electrode 230 may be provided or disposed in the subpixels PXa located or disposed on the first display area DA1. However, because the first display area DA1 may include the transmission area TA and the subpixel area PA1 where the subpixels PXa may be located or disposed, a portion of the opposite electrode 230 may not be provided or disposed in some areas corresponding to the transmission area TA. In the case of a top-emission type display apparatus, light may be emitted toward the opposite electrode 230, but the transmittance of the transmission area TA may be partially reduced by the opposite electrode 230. Thus, by not providing or disposing the opposite electrode 230 in the area corresponding to the transmission area TA, the transmittance of the transmission area TA may be improved.

For this purpose, the opposite electrode 230 arranged or disposed on the first display area DA1 may have a patterned shape for each of the subpixel areas PA1. The opposite electrode 230 located or disposed in the first display area DA1 may be formed by removing some area corresponding to the transmission area TA through laser lift-off, or may be formed through fine metal mask (FMM) mask patterning. Hereinafter, in an embodiment, it may be assumed that the opposite electrode 230 may be formed on the first display area DA1 through FMM mask patterning.

Figure 9:
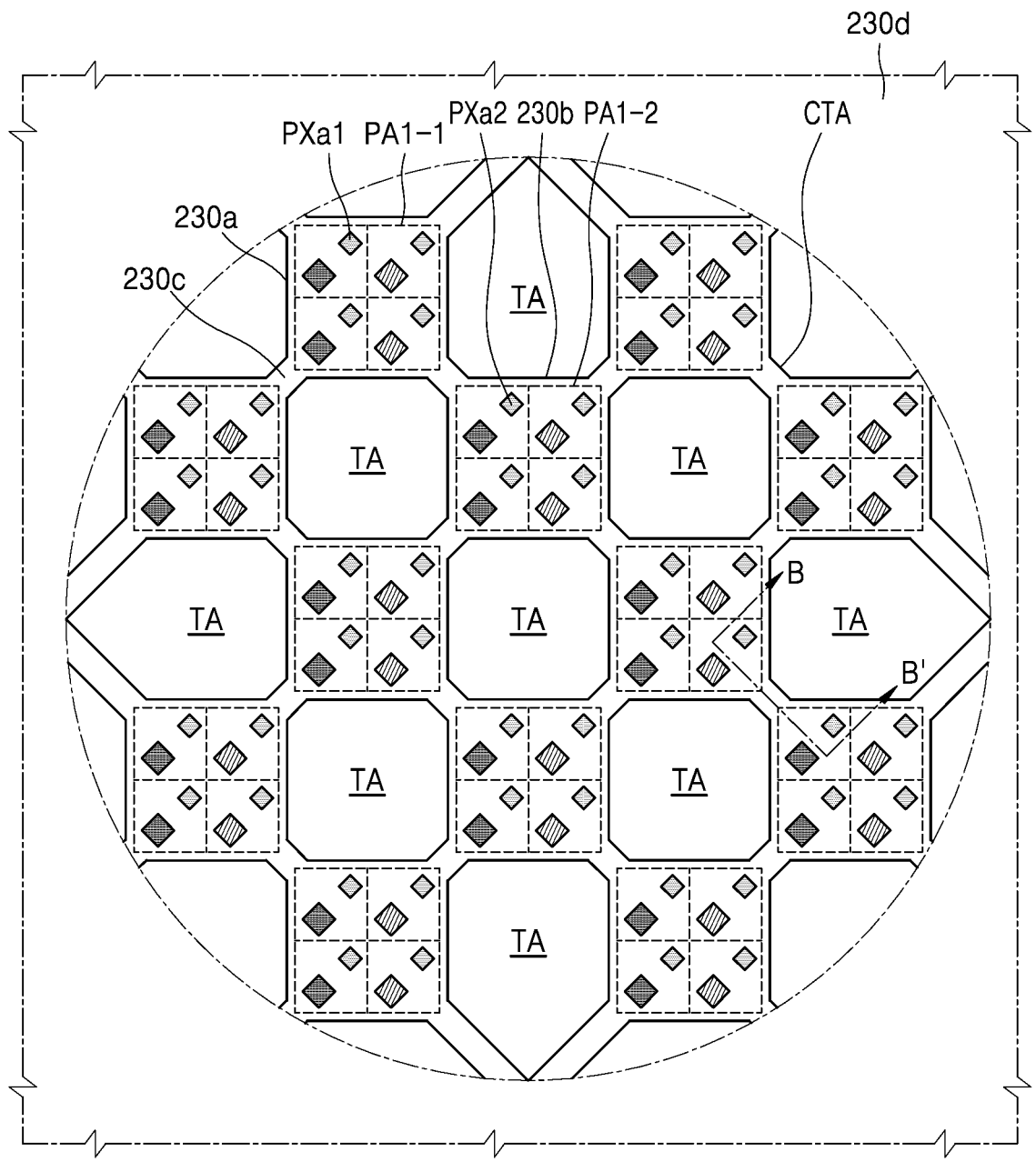
FIG. 9 is a plan view illustrating a portion of a first display area according to an embodiment.
Figure 9:
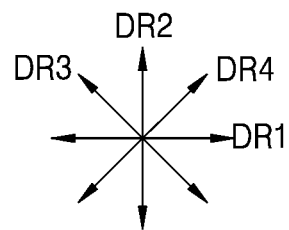
Figure 10:
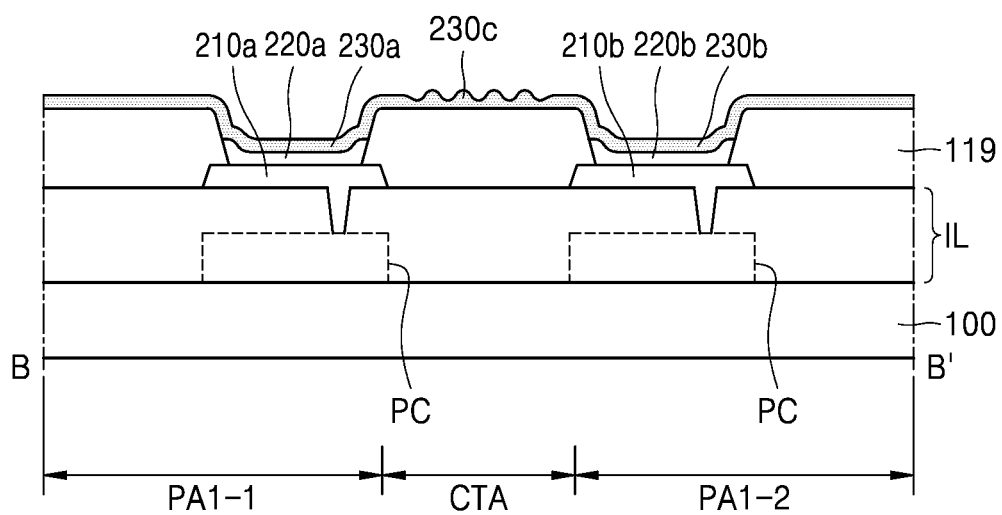
FIG. 10 is a schematic cross-sectional view of a portion of the first display area taken along line B-B' of FIG. 9.

FIG. 9 is a plan view illustrating a portion of a first display area according to an embodiment. FIG. 10 is a schematic cross-sectional view of a portion of the first display area taken along line B-B' of FIG. 9.

Referring to FIGS. 9 and 10, the first display area DA1 may include a subpixel area PA1 and a transmission area TA, and subpixels PXa may be arranged or disposed in the subpixel area PA1. As illustrated in FIG. 9, the subpixel area PA1 may include a first pixel area PA1-1 and a second pixel area PA1-2, first pixels PXa1 may be arranged or disposed in the first pixel area PA1-1, and second pixels PXa2 may be arranged or disposed in the second pixel area PA1-2.

In an embodiment, a first opposite electrode 230a may be provided or disposed on the first pixel area PA1-1, and a second opposite electrode 230b may be provided or disposed on the second pixel area PA1-2. The first opposite electrode 230a may be arranged or disposed to correspond to the first pixel area PA1-1, and the second opposite electrode 230b may be arranged or disposed to correspond to the second pixel area PA1-2. In this case, the shape of the first opposite electrode 230a and the shape of the second opposite electrode 230b may be similar to or identical to each other.

First pixels PXa1 arranged or disposed on the first pixel area PA1-1 may include a first opposite electrode 230a integrally formed on one first pixel area PA1-1.

Second pixels PXa2 arranged or disposed on the second pixel area PA1-2 may include a second opposite electrode 230b integrally formed on one second pixel area PA1-2.

Each of the first pixel area PA1-1 and the second pixel area PA1-2 may be provided in plurality. In this case, first pixel areas PA1-1 and second pixel areas PA1-2 may be arranged or disposed in various ways. For example, some of the first pixel areas PA1-1 may be linearly arranged or disposed in the first direction, and some of the second pixel areas PA1-2 may be arranged or disposed in a line different than that of some of the first pixel areas PA1-1, as illustrated in FIG. 9. In this case, the first pixel area PA1-1 and the second pixel area PA1-2 may be arranged or disposed to cover or overlap the transmission area TA. For example, the first pixel area PA1-1 and the second pixel area PA1-2 may be arranged or disposed in a zigzag shape. In an embodiment, first pixel areas PA1-1 and second pixel areas PA1-2 may be arranged or disposed in the same line. In this case, each of the first pixel areas PA1-1 and each of the second pixel areas PA1-2 may be alternately arranged or disposed. In an embodiment, first pixel areas PA1-1 and second pixel areas PA1-2 may be arranged or disposed in different lines. In this case, some of the first pixel areas PA1-1 arranged or disposed in one line and some of the second pixel areas PA1-2 arranged or disposed in one line may be spaced apart from each other in the second direction and may be linearly arranged or disposed in the first direction. In the above case, the first pixel areas PA1-1 and the second pixel areas PA1-2 may be arranged or disposed to be spaced apart from each other, and each first pixel area PA1-1 and each second pixel area PA1-2 adjacent to each other may not overlap each other.

The first pixel areas PA1-1 and the second pixel areas PA1-2 may be electrically connected to each other through a connection area CTA. In this case, a bridge electrode 230c, which will be described below, may be arranged or disposed in the connection area CTA to electrically connect the opposite electrodes on the pixel areas spaced apart from each other. In this case, connection areas CTA may be provided or disposed, and bridge electrodes 230c arranged or disposed in the connection areas CTA may electrically connect at least two pixel areas to each other. For example, some of the bridge electrodes 230c may electrically connect the first opposite electrodes 230a on the first pixel areas PA1-1 to each other. Other of the bridge electrodes 230c may electrically connect the second opposite electrodes 230b on the second pixel areas PA1-2 to each other. Other bridge electrodes 230c may electrically connect the first opposite electrode 230a of the first pixel area PA1-1 and the second opposite electrode 230*b* of the second pixel area PA1-2, which may be spaced apart from each other, to each other. In an embodiment, the bridge electrode 230*c* may electrically connect the first opposite electrode 230*a* and the second opposite electrode 230*b* spaced apart from each other, to each other. In an embodiment, the bridge electrodes 230*c* may electrically connect the opposite electrodes adjacent to each other, to each other. In this case, the bridge electrode 230*c* is not limited to the above and may have any structure in which at least two opposite electrodes among the first opposite electrodes 230*a* and the second opposite electrodes 230*b* are electrically connected to each other.

The first opposite electrode 230*a* and the second opposite electrode 230*b* may be arranged or disposed to respectively correspond to the first pixel area PA1-1 and the second pixel area PA1-2. In this case, first opposite electrodes 230*a* and second opposite electrodes 230*b* may be arranged or disposed to respectively correspond to the first pixel area PA1-1 and the second pixel area PA1-2.

In the above case, each first opposite electrode 230*a* and each second opposite electrode 230*b* may be electrically connected through the bridge electrode 230*c* as described above.

A third opposite electrode 230*d* may be arranged or disposed on the entire surface of the second display area DA2. In this case, the third opposite electrode 230*d* may be electrically connected to at least one of the first opposite electrode 230*a*, the second opposite electrode 230*b*, and the bridge electrode 230*c*. The first opposite electrode 230*a*, the second opposite electrode 230*b*, the third opposite electrode 230*d*, and the bridge electrode 230*c* described above may be integrally formed with each other. Hereinafter, for convenience of description, a detailed description will be given mainly of an example in which the third opposite electrode 230*d* may be electrically connected to at least one of the bridge electrodes 230*c*.

The bridge electrode 230*c* described above may be arranged or disposed on and contact various layers. For example, the bridge electrode 230*c* may be arranged or disposed on a functional layer of an intermediate layer (not illustrated). In an embodiment, the bridge electrode 230*c* may be arranged or disposed on a pixel definition layer 119. Hereinafter, for convenience of description, a detailed description will be given mainly of an example in which the bridge electrode 230*c* may be arranged or disposed on the pixel definition layer 119. In this case, a pixel electrode (not illustrated) may not be arranged or disposed between the bridge electrode 230*c* and the substrate 100.

The thickness of the bridge electrode 230*c* described above may vary in the lengthwise direction thereof. In this case, the lengthwise direction of the bridge electrode 230*c* may be the direction from one of opposite electrodes electrically connected to each other by the bridge electrodes 230*c* to the other of the opposite electrodes. For example, the lengthwise direction of the bridge electrode 230*c* may be the direction from one of the first opposite electrode 230*a* and the second opposite electrode 230*b* of FIG. 9 to the other of the first opposite electrode 230*a* and the second opposite electrode 230*b*. The thickness of the bridge electrode 230*c* may be measured by cutting in a direction perpendicular to the lengthwise direction of the bridge electrode 230*c*. For example, in FIG. 9, the thickness of the bridge electrode 230*c* may be the vertical distance from the upper surface of the pixel definition layer 119 on which the bridge electrode 230*c* may be arranged or disposed to the upper surface of the bridge electrode 230*c*.

In the above case, the thickness of the bridge electrode 230*c* may vary in the lengthwise direction of the bridge electrode 230*c*. In this case, the thickness of the bridge electrode 230*c* may be largest or thickest at one or more portions between the first opposite electrode 230*a* and the second opposite electrode 230*b* and may be an uneven layer. For example, in an embodiment, the thickness of the bridge electrode 230*c* may be largest at only one portion of the bridge electrode 230*c* in the lengthwise direction of the bridge electrode 230*c*. In this case, the thickness of the bridge electrode 230*c* may decrease from the thickest portion of the bridge electrode 230*c* toward both sides of the thickest portion of the bridge electrode 230*c*. For example, the thickest portion of the bridge electrode 230*c* may be arranged or disposed between the first opposite electrode 230*a* and the second opposite electrode 230*b*, and the thinnest portion of the bridge electrode 230*c* may be a portion overlapping at least one of the first opposite electrode 230*a* and the second opposite electrode 230*b*. In an embodiment, the bridge electrode 230*c* may have at least two portions having the largest thickness of the bridge electrode 230*c*. In this case, the thickness of the bridge electrode 230*c* may decrease from the thickest portion of the bridge electrode 230*c* toward both sides of the thickest portion of the bridge electrode 230*c*. The thickness of the bridge electrode 230*c* may increase from the thinnest portion of the bridge electrode 230*c* toward both sides of the thinnest portion of the bridge electrode 230*c*. In the above case, the thickness of the bridge electrode 230*c* may decrease from the thickest portion of the bridge electrode 230*c* toward the thinnest portion of the bridge electrode 230*c*.

The largest or greatest thickness of the bridge electrode 230*c* may be equal (or substantially equal) to the largest or greatest thickness among the thicknesses of at least one of the first opposite electrodes 230*a* and the second opposite electrode 230*b*.

In the above case, in the first display area DA1, first opposite electrodes 230*a* and second opposite electrodes 230*b* may be electrically connected to each other like a net or mesh through bridge electrodes 230*c*. For example, because a transmission area TA may be arranged or disposed between the first opposite electrode 230*a*, the second opposite electrode 230*b*, and the bridge electrode 230*c* electrically connected to each other and a separate opposite electrode may not be arranged or disposed in the transmission area TA, the light transmittance of the first display area DA1 may be secured and also a voltage may be applied to the pixel area arranged or disposed in the first display area DA1.

Figure 11:
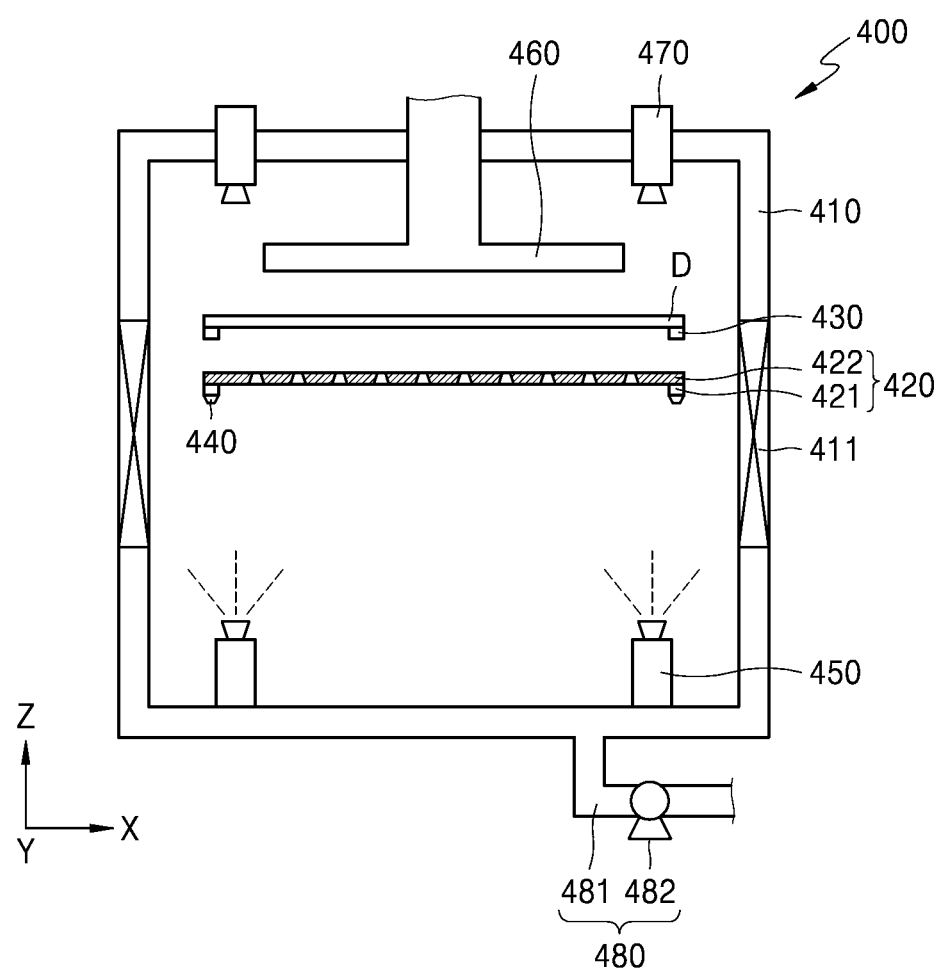
FIG. 11 is a schematic cross-sectional view schematically illustrating a display apparatus manufacturing apparatus according to an embodiment.
Figure 12:
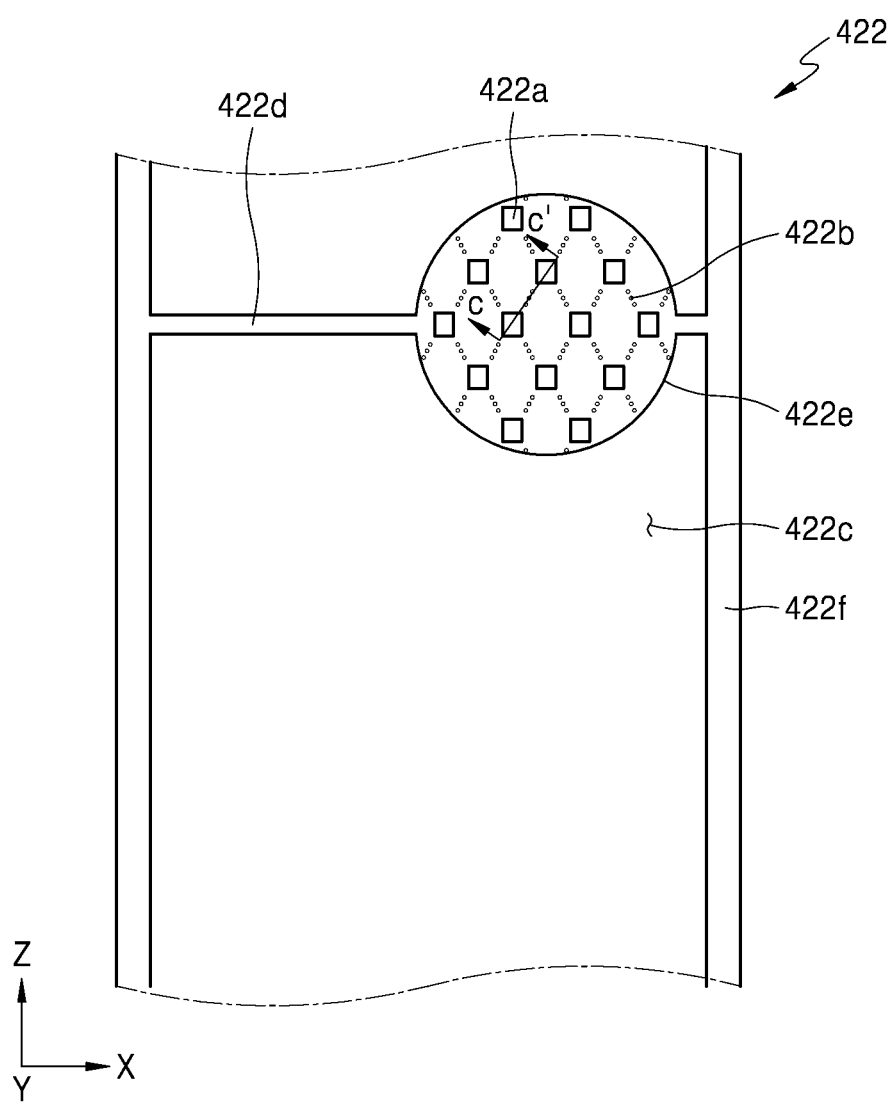
FIG. 12 is a plan view illustrating a portion of a mask sheet illustrated in FIG. 11.
Figure 13:
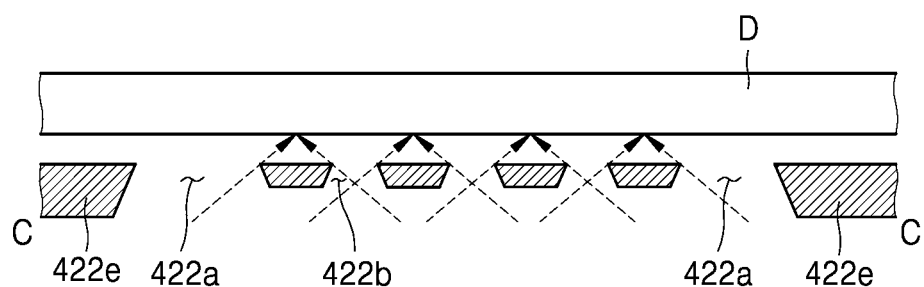
FIG. 13 is a schematic cross-sectional view of a portion of the mask sheet taken along line C-C' of FIG. 12.
Figure 13:
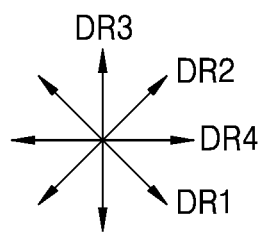

FIG. 11 is a schematic cross-sectional view schematically illustrating a display apparatus manufacturing apparatus according to an embodiment. FIG. 12 is a plan view illustrating a portion of a mask sheet illustrated in FIG. 11. FIG. 13 is a schematic cross-sectional view of a portion of the mask sheet taken along line C-C' of FIG. 12.

Referring to FIGS. 11 to 13, a main pixel (not illustrated) of the display apparatus 1 may be manufactured through a display apparatus manufacturing apparatus 400.

The display apparatus manufacturing apparatus 400 may include a chamber 410, a mask assembly 420, a first support portion 430, a second support portion 440, a deposition source 450, a magnetic force generating portion 460, and a vision portion or portions 470, and a pressure adjusting portion 480.

The chamber 410 may have a space formed therein, and a portion of the chamber 410 may be formed to be open. In this case, a gate valve 411 may be arranged or disposed at an open portion of the chamber 410 to be opened and closed.

The mask assembly 420 may be selectively arranged or disposed in the chamber 410. In this case, the mask assembly 420 may include a mask frame 421 and a mask sheet 422. The mask frame 421 may be formed by connecting frames to each other and may include an opening portion therein. In this case, the mask frame 421 may include one opening portion or opening portions separated from each other. In this case, the mask frame 421 may be formed in a grid shape like a window frame or other shape within the spirit and the scope of the disclosure. The mask sheet 422 may be fixed to the mask frame 421 in a tensioned state. In this case, the mask sheet 422 may have an opening portion arranged or disposed to pass a deposition material therethrough.

The mask sheet 422 may include a mask sheet body 422f, a rib 422d, and a shielding portion 422e. In this case, the shielding portion 422e may include at least one first opening portion 422a through which a deposition material may pass to form a first opposite electrode (not illustrated) or a second opposite electrode (not illustrated) described above. The shielding portion 422e may include at least one second opening portion 422b for forming a bridge electrode (not illustrated) described above. In this case, when second opening portions 422b are provided, the shapes of the second opening portions 422b may be similar to or identical to or different from each other. The planar area of each second opening portion 422b may be less than the planar area of the first opening portion 422a. The mask sheet body 422f may include a third opening portion 422c for forming a third opposite electrode (not illustrated) described above.

The mask sheet body 422f may have a third opening portion 422c therein, and the rib 422d may be arranged or disposed across the third opening portion 422c to connect the shielding portion 422e to the mask sheet body 422f. The width of the rib 422d (for example, the width of the rib 422d measured in the Y-axis direction of FIG. 12) may be formed to be small or thin, thereby preventing the deposition material from not being deposited onto a display substrate D arranged or disposed behind the rib 422d.

The shielding portion 422e may be formed in a plate shape, and the shielding portion 422e may completely block the deposition material to prevent the deposition material from being deposited to the display substrate D. In this case, the deposition material may pass through the first opening portion 422a and the second opening portion 422b arranged or disposed in the shielding portion 422e, to form a first display area (not illustrated) of the display substrate D. As an example, the deposition material passed through the first opening portion 422a may form the first opposite electrode and the second opposite electrode, and the deposition material passed through the second opening portion 422b may form the bridge electrode.

The shielding portion 422e may be formed to have different thicknesses. For example, the thickness of a portion of the shielding portion 422e at which the first opening portion 422a may be arranged or disposed and the thickness of a portion of the shielding portion 422e at which the second opening portion 422b may be arranged or disposed may be different from each other. In this case, the thickness of the shielding portion 422e at the edge portion of the first opening portion 422a adjacent to the second opening portion 422b among the portions forming the edge of the first opening portion 422a adjacent to the second opening portion 422b may be less than the thickness of the shielding portion 422e at the edge portion of the first opening portion 422a not adjacent to the second opening portion 422b. For example, as illustrated in FIG. 13, the thickness of a portion of the shielding portion 422e at which the second opening portion 422b may be arranged or disposed may be less than the thickness of a portion of the shielding portion 422e at which the first opening portion 422a may be arranged or disposed. In this case, because the deposition material passed through the second opening portion 422b may reach a rear portion of the shielding portion 422e at which the second opening portion 422b may be arranged or disposed, the disconnection of the bridge electrode may be prevented when the deposition material passed through the second opening portion 422b forms the bridge electrode. The thickest portion of the bridge electrode may be arranged or disposed on the display substrate D to correspond to the center of the second opening portion 422b, and the thinnest portion of the bridge electrode may be arranged or disposed on the display substrate D to correspond to the rear portion of the shielding portion 422e arranged or disposed around the second opening portion 422b. For example, the thinnest portion of the bridge electrode may be arranged or disposed at the rear portion of the shielding portion 422e between the second opening portions 422b adjacent to each other and at the rear portion of the shielding portion 422e between the first opening portion 422a and the second opening portion 422b adjacent to each other.

The first opening portion 422a, the second opening portion 422b, and the third opening portion 422c may have various shapes. For example, one example shape of the first opening portion 422a, the shape of the second opening portion 422b, and the shape of the third opening portion 422c may include at least one of a circular shape, a polygonal shape, and an elliptical shape or other shapes within the spirit and the scope of the disclosure. Hereinafter, for convenience of description, a detailed description will be given mainly of a case where the shape of the first opening portion 422a and the shape of the third opening portion 422c may be tetragonal and the shape of the second opening portion 422b may be circular.

The shape of the first opening portion 422a may be formed to correspond to the first pixel area PA1-1 or the second pixel area PA1-2. For example, the shape of the first opening portion 422a may include a rectangular shape, a square shape, or a diamond shape. In this case, the deposition material may pass through the first opening portion 422a may be deposited onto the substrate 100 to form the first opposite electrode or the second opposite electrode. In this case, when first opening portions 422a are provided, the first opening portions 422a may be sufficiently spaced apart from each other such that they may not be connected to each other after the deposition material passed through each first opening portion 422a may be deposited onto the substrate 100. In this case, the edge portion of the first opening portion 422a may be in a chamfered state.

As described above, the second opening portion 422b may be arranged or disposed between the first opening portions 422a. For example, the second opening portion 422b may be arranged or disposed between the first opening portions 422a adjacent to each other. In this case, at least one second opening portion 422b may be arranged or disposed. When second opening portions 422b are provided, the second opening portions 422b may be linearly arranged or disposed between two of the first opening portions 422a.

The third opening portion 422c may be arranged or disposed at the mask sheet body 422f, and the shielding portion 422e may be arranged or disposed in the third opening portion 422c. In this case, the deposition material passed through the third opening portion 422c may be deposited onto the display substrate D to form the third opposite electrode. In this case, the third opposite electrode may be electrically connected to at least one of the bridge electrodes and may be arranged or disposed to surround the first opposite electrode and the second opposite electrode on a plane.

The substrate 100 may be seated on the first support portion 430. In this case, the first support portion 430 may adjust the position of the substrate 100. For example, the first support portion 430 may include a UVW stage.

The mask assembly 420 may be seated on the second support portion 440. In this case, similar to the first support portion 430, the second support portion 440 may adjust the position of the mask assembly 420.

After the deposition material is received, the deposition source 450 may vaporize or sublime the deposition material and supply the vaporized or sublimed deposition material to the chamber 410. In this case, the deposition source 450 may include a heater therein and may melt or sublime the deposition material by heating the deposition material in the deposition source 450 by the operation of the heater. In this case, the deposition source 450 may be arranged or disposed at about the center or edge of the chamber 410. Hereinafter, for convenience of description, a detailed description will be given mainly of a case where the deposition source 450 may be arranged or disposed at an edge of the chamber 410. It is to be understood that there may be more than one deposition source 450.

The magnetic force generating portion 460 may be arranged or disposed in the chamber 410 to closely contact the substrate 100 and the mask assembly 420 with each other. In this case, the magnetic force generating portion 460 may include an electromagnet or a permanent magnet for generating a magnetic force.

The vision portion or portions 470 may be arranged or disposed in the chamber 410 to photograph the position of the mask assembly 420 and the substrate 100. In this case, the vision portion or portions 470 may photograph an alignment mark or the like of at least one of the mask assembly 420 and the substrate 100.

The pressure adjusting portion 480 may be connected to the chamber 410 to adjust the pressure inside the chamber 410. In this case, the pressure adjusting portion 480 may include a connection pipe 481 connected to the chamber 410 and a pump 482 arranged or disposed at the connection pipe 481.

A main pixel (not illustrated) or a display apparatus (not illustrated) may be manufactured by the display apparatus manufacturing apparatus 400. In this case, the display apparatus manufacturing apparatus 400 may manufacture the main pixel or the display apparatus (not illustrated) according to the embodiments described above as well as embodiments described below. However, hereinafter, for convenience of description, a detailed description will be given mainly of a case where the display apparatus manufacturing apparatus 400 manufactures a main pixel (not illustrated) including the pixel area illustrated in FIGS. 8 and 9. Hereinafter, like reference numerals as those in FIGS. 8 and 9 denote like members or elements.

For example, the mask assembly 420 and the display substrate D including a substrate (not illustrated) with an insulating layer (not illustrated) formed thereat may be arranged or disposed in the chamber 410. In this case, the substrate may be in a state where a pixel electrode (not illustrated) and an organic emission layer (not illustrated) among a thin film transistor (not illustrated) and an organic light emitting diode (not illustrated) may be formed on the substrate.

After the display substrate D and the mask assembly 420 are respectively seated on the first support portion 430 and the second support portion 440, the substrate 100 and the mask assembly 420 may be photographed through the vision portion or portions 470. Thereafter, the display substrate D and the mask assembly 420 may be aligned.

When the deposition source or sources 450 operates or operate to supply the deposition material, the deposition material may pass through the first opening portion 422*a*, the second opening portion 422*b*, and the third opening portion 422*c* of the mask sheet 422 to be deposited onto the pixel definition layer and the organic light emitting layer of the display substrate D. In this case, the deposition material passed through the first opening portion 422*a* may form the first opposite electrode 230*a* and the second opposite electrode 230*b* as described above, the deposition material passed through the second opening portion 422*b* may form the bridge electrode 230*c*, and the deposition material passed through the third opening portion 422*c* may form the third opposite electrode 230*d*.

When deposited as above, the first opposite electrode 230*a* and the second opposite electrode 230*b* may be arranged or disposed in a serpentine (or zigzag) shape.

In this case, the deposition material passed through the second opening portion 422*b* may connect the first opposite electrode 230*a* to the second opposite electrode 230*b* by forming the bridge electrode 230*c* having different thicknesses at the respective portions thereof. The bridge electrode 230*c* arranged or disposed at an outer portion of the first display area DA1 may electrically connect the first opposite electrode 230*a* or the second opposite electrode 230*b* and the third opposite electrode 230*d* to each other. In this case, the first opposite electrode 230*a*, the second opposite electrode 230*b*, the third opposite electrode 230*d*, and the bridge electrode 230*c* may be integrally formed to be electrically connected to each other.

Thus, the opposite electrodes arranged or disposed on the display substrate D may be electrically connected to each other through the bridge electrode 230*c* through a single process. By depositing the deposition material onto the display substrate D while maintaining the constant position of the display substrate D and the mask assembly 420 without replacing the mask assembly 420 when forming each opposite electrode and the bridge electrode, an error in the deposition material pattern due to a change in the position of the mask assembly 420 or an alignment error between the mask assembly 420 and the display substrate D may be reduced.

Figure 14A:
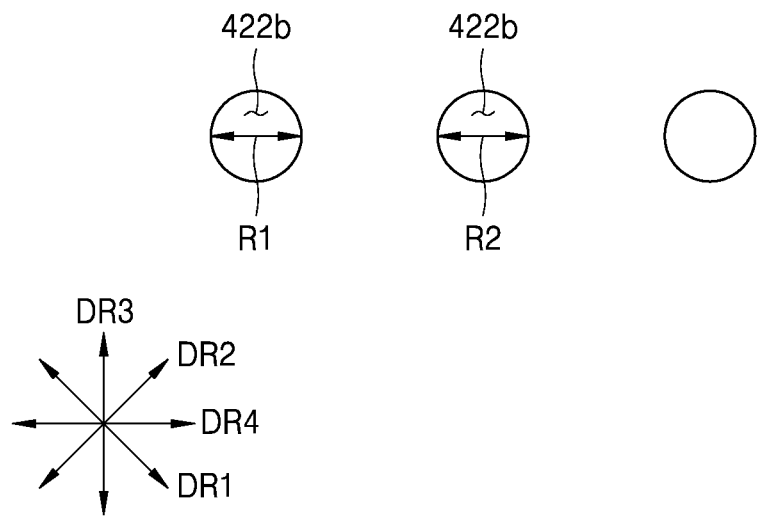
FIGS. 14A to 14C are plan views illustrating embodiments of a second opening portion illustrated in FIG. 11.
Figure 14B:
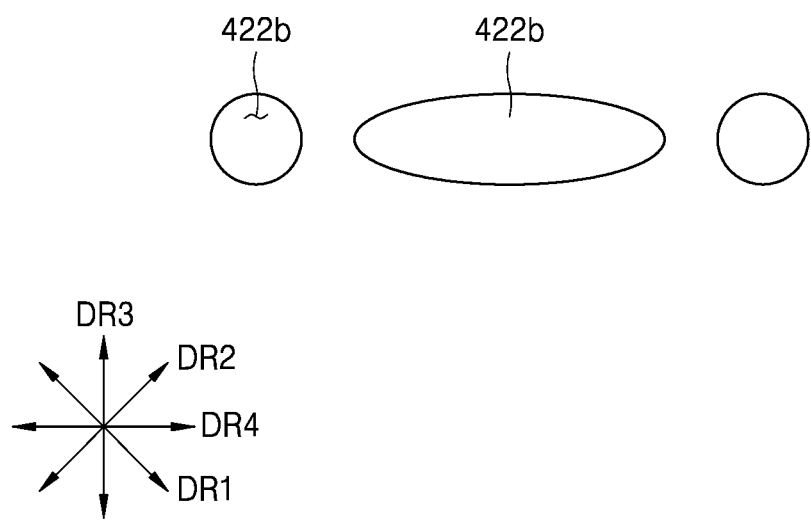
Figure 14C:
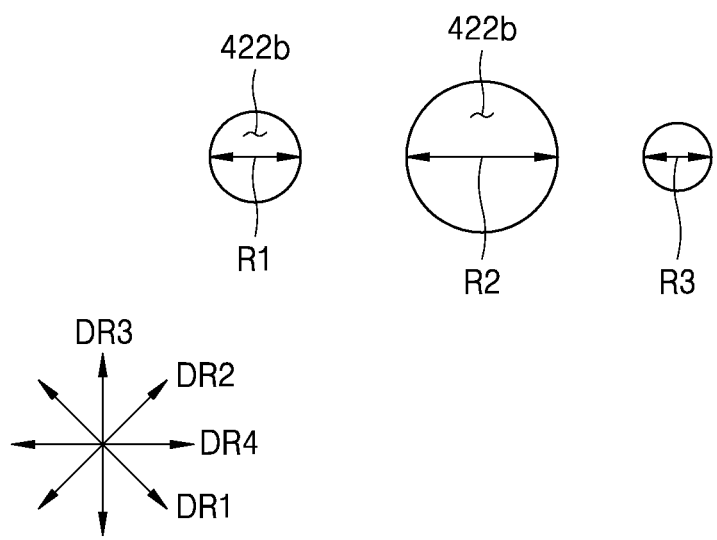

FIGS. 14A to 14C are plan views illustrating embodiments of a second opening portion illustrated in FIG. 11.

Referring to FIGS. 14A to 14C, second opening portions 422*b* may be provided as described above. In this case, at least one of the shape and size of some of the second opening portions 422*b* may be similar to or identical to or different from at least one of the shape and size of others of the second opening portions 422*b*.

For example, as illustrated in FIG. 14A, second opening portions 422*b* arranged or disposed between two first opening portions (not illustrated) may all have the same shape and the same size. For example, each of the second opening portions 422*b* illustrated in FIG. 14A may be circular, and diameters R1 and R2 (or radiuses) of the second opening portions 422*b* may all be the same or about the same.

In an embodiment, as illustrated in FIG. 14B, the size and shape of some of second opening portions 422*b* arranged or disposed between two first opening portions may be different from the size and shape of others of the second opening portions 422*b*. For example, the second opening portion 422*b* arranged or disposed in the middle of the second opening portions 422*b* may be elliptical, and the other second opening portions 422*b* of second opening portions 422*b* may be circular.

In an embodiment, as illustrated in FIG. 14C, the sizes of second opening portions 422*b* arranged or disposed between two first opening portions may all be different from each other. In this case, the distances between the second opening portions 422*b* may be different from each other. The second opening portions 422*b* may all be circular, and a diameter R2 of the second opening portion 422*b* arranged or disposed in the middle of the second opening portions 422*b* may be larger or smaller than a diameter R1 of the second opening portion 422*b* arranged or disposed first among the second opening portions 422*b*. A diameter R3 of the second opening portion 422*b* arranged or disposed last among the second opening portions 422*b* may be less than the diameter of the other second opening portions 422*b*.

The arrangement order, size, and shape of the second opening portions 422*b* are not limited to the above and may be combined in various ways. For example, it may also be possible to select and arrange or dispose the second opening portions 422*b* having different shapes and different sizes among the second opening portions 422*b* illustrated in FIGS. 14A to 14C.

The plurality of second opening portions 422*b* may have different shapes or different sizes but may all be linearly arranged or disposed. For example, the centers of the second opening portions 422*b* may be arranged or disposed in a straight line.

The second opening portions 422*b* may be arranged or disposed in various ways in addition to being linearly arranged or disposed. For example, the second opening portions 422*b* may be arranged or disposed in a curved shape or in a zigzag shape. In this case, the arrangement of the second opening portions 422*b* is not limited to the above, and the second opening portions 422*b* may be arranged or disposed to provide the largest size of a transmission area (not illustrated).

Figure 15:
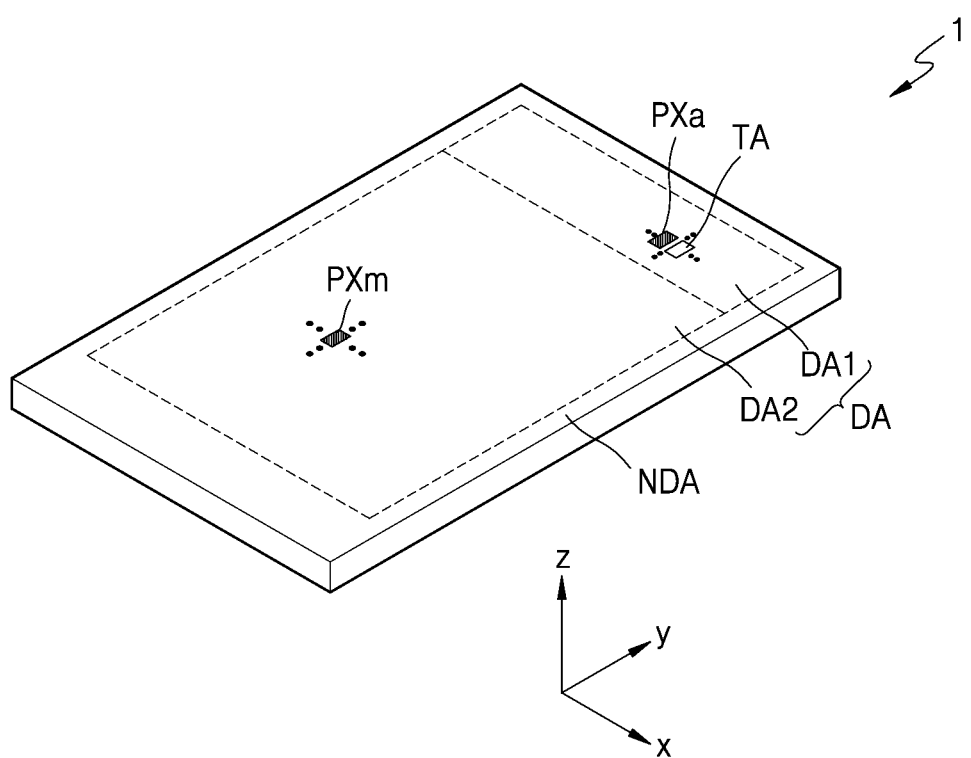
FIG. 15 is a perspective view illustrating a display apparatus according to an embodiment.
Figure 16:
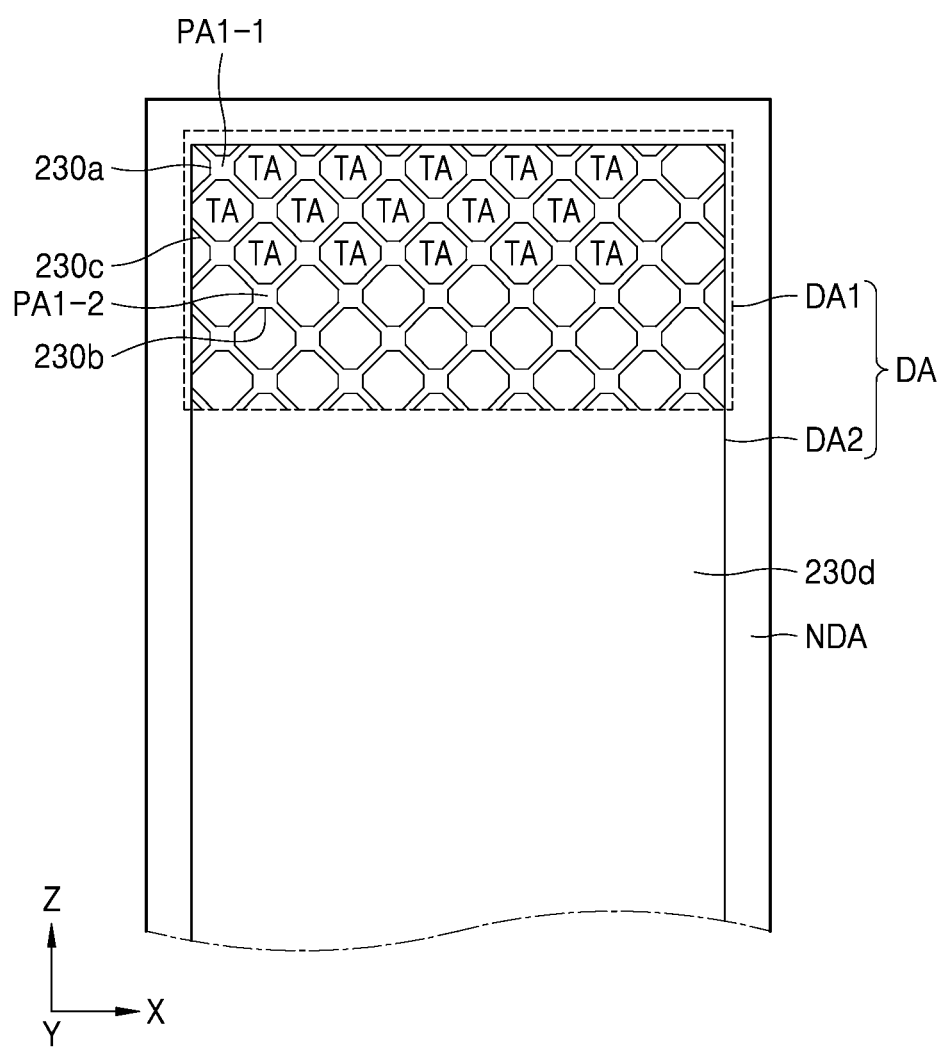
FIG. 16 is a plan view illustrating an opposite electrode of a display panel of the display apparatus illustrated in FIG. 15.
Figure 17:
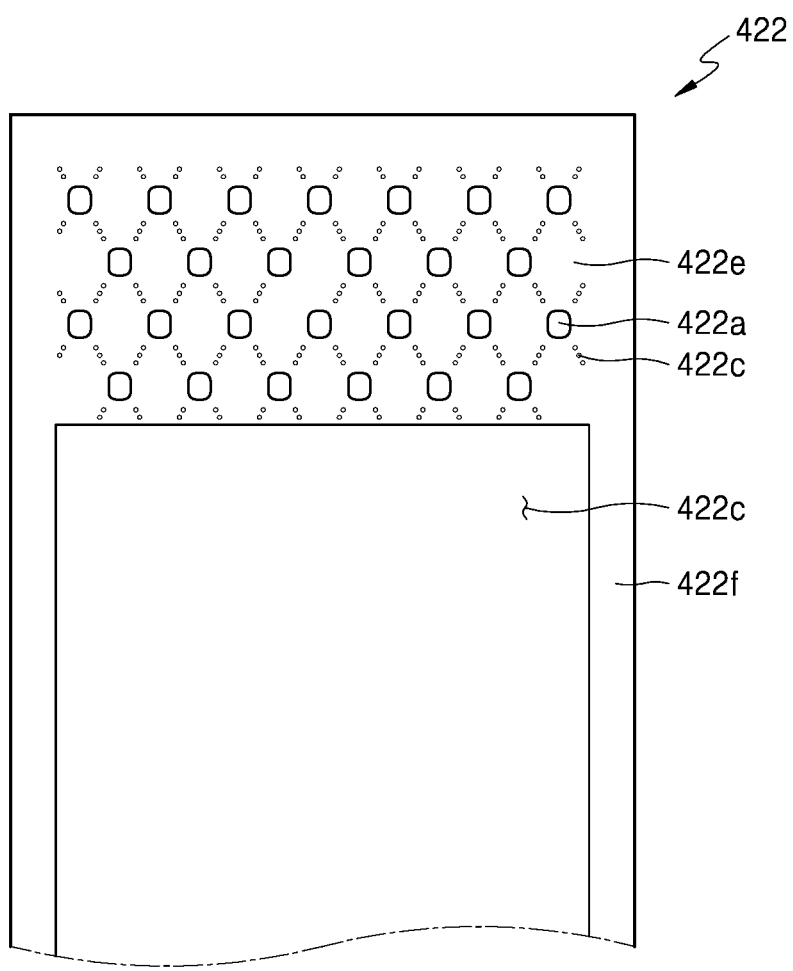
FIG. 17 is a plan view illustrating a portion of a mask sheet used to manufacture the display panel illustrated in FIG. 16.

FIG. 15 is a perspective view illustrating a display apparatus according to an embodiment. FIG. 16 is a plan view illustrating an opposite electrode of a display panel of the display apparatus illustrated in FIG. 15. FIG. 17 is a plan view illustrating a portion of a mask sheet used to manufacture the display panel illustrated in FIG. 16.

Referring to FIGS. 15 to 17, a display apparatus 1 may be similar to that illustrated in FIG. 1. In this case, the display apparatus 1 may include a first display area DA1, a second display area DA2, and a non-display area NDA.

The first display area DA1 may be an area of the display apparatus 1 unlike in FIG. 1. In this case, the first display area DA1 may be similar in shape to the second display area DA2. For example, the first display area DA1 may be formed long in the X-axis direction. The first display area DA1 may have a higher light transmittance than the second display area DA2, and the resolution of the first display area DA1 may be lower than the resolution of the second display area DA2. In this case, as described above, the subpixel PXa may be arranged or disposed in the first display area DA1, and the main pixel PXm may be arranged or disposed in the second display area DA2. The first display area DA1 may include the transmission area TA in which the subpixel PXa may not be arranged or disposed.

A component may be arranged or disposed in various positions in the first display area DA1. In this case, at least one component may be arranged or disposed in the first display area DA1. For example, when components may be arranged or disposed in the first display area DA1, the components may be arranged or disposed to be spaced apart from each other in the first display area DA1.

The first display area DA1 may include a first pixel area PA1-1, a second pixel area PA1-2, and a transmission area TA. In this case, the first pixel area PA1-1 and the second pixel area PA1-2 may alternate with each other, and the transmission area TA may be defined by the first pixel area PA1-1 and the second pixel area PA1-2 adjacent to each other. For example, the transmission area TA may be shielded by the first pixel area PA1-1 and the second pixel area PA1-2 connected to each other. The first opposite electrode 230*a* and the second opposite electrode 230*b* may be arranged or disposed in the first pixel area PA1-1 and the second pixel area PA1-2, respectively. The first pixel area PA1-1 and the second pixel area PA1-2 may be electrically connected to each other by the connection area CTA. In this case, the first opposite electrode 230*a* of the first pixel area PA1-1 and the second opposite electrode 230*b* of the second pixel area PA1-2 may be electrically connected through the bridge electrode 230*c* of the connection area CTA. The first pixel PXa1 and the second pixel PXa2 may be arranged or disposed in the first pixel area PA1-1 and the second pixel area PA1-2, respectively.

The third opposite electrode 230*d* may be arranged or disposed in the second display area DA2. In this case, the third opposite electrode 230*d* may be arranged or disposed to cover or overlap the entire surface of the second display area DA2. The third opposite electrode 230*d* may be electrically connected to at least one of the first opposite electrode 230*a*, the second opposite electrode 230*b*, and the bridge electrode 230*c*. Hereinafter, for convenience of description, a detailed description will be given mainly of a case where the third opposite electrode 230*d* may be electrically connected to the bridge electrode 230*c*.

The display apparatus 1 described above may be manufactured through the display apparatus manufacturing apparatus 400 illustrated in FIG. 11. In this case, the mask sheet 422 may be the same as or similar to that illustrated in FIG. 17.

The mask sheet 422 may include a mask sheet body 422*f* and a shielding portion 422*e*. In this case, the third opening portion 422*c* may be arranged or disposed in the mask sheet body 422*f*. For example, the third opening portion 422*c* may have a tetragonal shape to correspond to the second display area DA2.

The shielding portion 422*e* may have a shape corresponding to the first display area DA1. In this case, the first opening portion 422*a* and the second opening portion 422*b* may be arranged or disposed in the shielding portion 422*e*. The first opening portion 422*a* may have a shape corresponding to each of the first opposite electrode 230*a* and the second opposite electrode 230*b* and may be arranged or disposed at each position corresponding thereto. In this case, the edge of the first opening portion 422*a* may be in a chamfered state. For example, the edge of the first opening portion 422*a* may be rounded or inclined in a direction. At least one second opening portion 422*b* may be arranged or disposed between the first opening portions 422*a*. The second opening portions 422*b* may be formed in a dot shape and linearly arranged or disposed. In this case, the shape of the second opening portion 422b may include various shapes such as a circular shape, an elliptical shape, and a polygonal shape. However, the disclosure is not limited thereto.

In the above case, the first opposite electrode 230a, the second opposite electrode 230b, the bridge electrode 230c, and the third opposite electrode 230d may be formed through the display apparatus manufacturing apparatus 400. In this case, the first opposite electrode 230a and the second opposite electrode 230b may be spaced apart from each other so as not to overlap each other, and the bridge electrode 230c may electrically connect the opposite electrodes spaced apart from each other in the first display area DA1. The third opposite electrode 230d may be arranged or disposed in the second display area DA2.

Thus, in the display apparatus 1, the opposite electrodes respectively formed in the first display area DA1 and the second display area DA2 may be electrically connected to each other.

Figure 18:
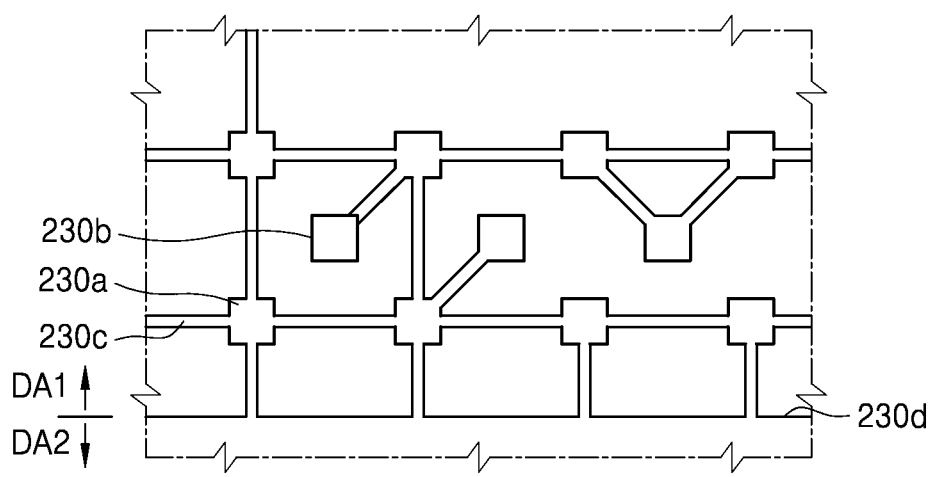
FIG. 18 is a plan view illustrating a portion of an opposite electrode of a main pixel of a display apparatus according to an embodiment.

FIG. 18 is a plan view illustrating a portion of an opposite electrode of a main pixel of a display apparatus according to an embodiment.

Referring to FIG. 18, a display apparatus (not illustrated) may include a first display area DA1 and a second display area DA2. In this case, the shapes of the first display area DA1 and the second display area DA2 may be identical or similar to those illustrated in FIG. 1 or 12.

One of the first opposite electrode 230a and the second opposite electrode 230b may be arranged or disposed in each pixel area arranged or disposed in the first display area DA1. In this case, the first opposite electrode 230a and the second opposite electrode 230b may be spaced apart from each other.

The first opposite electrode 230a and the second opposite electrode 230b described above may be arranged or disposed in various shapes. For example, the first opposite electrode 230a and the second opposite electrode 230b may be irregularly arranged or disposed in the first display area DA1. In an embodiment, the first opposite electrode 230a and the second opposite electrode 230b may be arranged or disposed in the same lines while matching rows and columns. In an embodiment, the first opposite electrode 230a and the second opposite electrode 230b may be arranged or disposed in a zigzag shape with respect to each other.

As above, the first opposite electrode 230a and the second opposite electrode 230b spaced apart from each other may be electrically connected through the bridge electrode 230c. In this case, the bridge electrode 230c may be a straight line, a curved line, a partially-bent line, or the like within the spirit and the scope of the disclosure. The bridge electrode 230c may not connect the opposite electrodes adjacent to each other, as illustrated in FIG. 18. However, hereinafter, for convenience of description, a detailed description will be given mainly of an example in which the bridge electrode 230c electrically connects the opposite electrodes adjacent to each, to each other as illustrated in FIG. 18.

The bridge electrode 230c may electrically connect the first opposite electrodes 230a adjacent to each other. In this case, the bridge electrodes 230c may be arranged or disposed in the arrangement direction of the first opposite electrodes 230a. The bridge electrode 230c may electrically connect the first opposite electrode 230a and the second opposite electrode 230b adjacent to each other. In this case, the bridge electrode 230c may electrically connect an edge of the first opposite electrode 230a to an edge of the second opposite electrode 230b.

The opposite electrodes arranged or disposed on the entire surface of the main pixel described above may be integrally formed by being connected to each other.

Thus, in the display apparatus, all of the opposite electrodes formed in the first display area DA1 and the second display area DA2 may be electrically connected to each other through the bridge electrode 230c. The display apparatus may increase the light transmittance by securing a sufficient transmission area TA in the first display area DA1.

In the display apparatus according to the embodiments, the display area may be extended such that image representation may be possible also in the area where the component may be arranged or disposed.

The display apparatus manufacturing apparatus and method according to the embodiments may simplify the manufacturing process by simultaneously connecting the opposite electrodes of the display area in which the component may be arranged or disposed.

The display apparatus manufacturing apparatus and method according to the embodiments may arrange or dispose various types of components in the display apparatus and may improve the transmittance of the area in which the component may be arranged or disposed.

However, the scope of the disclosure is not limited to these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
  a substrate including:
    a first display area including a first pixel area, a second pixel area spaced apart from the first pixel area, and a transmission area; and
    a second display area adjacent to the first display area;
  a first pixel disposed on the first pixel area and including:
    a first pixel electrode;
    a first opposite electrode; and
    a first intermediate layer disposed between the first pixel electrode and the first opposite electrode;
  a second pixel disposed on the second pixel area and including:
    a second pixel electrode;
    a second opposite electrode; and
    a second intermediate layer disposed between the second pixel electrode and the second opposite electrode; and
  a bridge electrode electrically connecting the first opposite electrode to the second opposite electrode, wherein
  a thickness of the bridge electrode varies in a direction from one of the first opposite electrode and the second opposite electrode toward the other one of the first opposite electrode and the second opposite electrode,
  the first opposite electrode, the second opposite electrode, and the bridge electrode are integral with each other such that the first opposite electrode, the second opposite electrode, and the bridge electrode are together made of a single, continuous electrode,
  the thickness of the bridge electrode varies such that a top surface of the bridge electrode forms an alternating concave-convex pattern while a bottom surface of the bridge electrode directly below the alternating concave-convex pattern is flat.

2. The display apparatus of claim 1, wherein a thickness of a portion of the bridge electrode is greater than a thickness of another portion of the bridge electrode.

3. The display apparatus of claim 1, further comprising a pixel definition layer disposed on the first pixel electrode and the second pixel electrode and including a first opening and a second opening each exposing a center portion of each of the first pixel electrode and the second pixel electrode, wherein
the bridge electrode is disposed on the pixel definition layer.

4. The display apparatus of claim 1, wherein a thickness of a thickest portion of the bridge electrode is substantially equal to a greatest thickness of the first opposite electrode or a greatest thickness of the second opposite electrode.

5. The display apparatus of claim 1, wherein the thickness of the bridge electrode decreases gradually from a thickest portion of the bridge electrode to a thinnest portion of the bridge electrode.

6. The display apparatus of claim 1, wherein a light transmittance of the first display area is different from a light transmittance of the second display area.

7. The display apparatus of claim 1, wherein a resolution of an image in the first display area is lower than a resolution of an image in the second display area.

8. The display apparatus of claim 1, further comprising a component disposed in the first display area.

9. The display apparatus of claim 1, wherein the thickness of the bridge electrode varies in an area where a bottom surface of the bridge electrode makes direct contact with an electrically insulating layer.

10. The display apparatus of claim 1, wherein the transmission area is disposed between the first opposite electrode, the second opposite electrode, and the bridge electrode.

11. A display apparatus comprising:
a substrate including:
a first display area including a plurality of pixel areas spaced apart from each other, and a transmission area; and
a second display area adjacent to the first display area;
a pixel disposed on each of the plurality of pixel areas and including:
a pixel electrode;
an opposite electrode; and
an intermediate layer disposed between the pixel electrode and the opposite electrode of each of the plurality of pixels; and
a bridge electrode electrically connecting the opposite electrodes of two immediately adjacent pixels of the plurality of pixels disposed in corresponding two pixel areas among the plurality of pixel areas spaced apart from each other, wherein a thickness of the bridge electrode varies between the opposite electrodes electrically connected to each other by the bridge electrode,
the opposite electrodes of the two immediately adjacent pixels and the bridge electrode are integral with each other such that the opposite electrodes of the two immediately adjacent pixels and the bridge electrode are together made of a single, continuous electrode, and
the thickness of the bridge electrode varies such that a top surface of the bridge electrode forms an alternating concave-convex pattern while a bottom surface of the bridge electrode directly below the alternating concave-convex pattern is flat.

12. The display apparatus of claim 11, wherein a thickest portion of the bridge electrode is disposed between the opposite electrodes electrically connected to each other by the bridge electrode.

13. The display apparatus of claim 11, wherein the bridge electrode electrically connects adjacent opposite electrodes among the opposite electrodes of the plurality of pixels.

14. The display apparatus of claim 11, further comprising a component disposed in the first display area.

15. The display apparatus of claim 11, wherein a light transmittance of the first display area is different from a light transmittance of the second display area.

16. A display apparatus comprising:
a substrate including:
a first display area including a plurality of pixel areas spaced apart from each other, and a transmission area;
a bridge electrode electrically connecting opposite electrodes of two immediately adjacent pixel areas among the plurality of pixel areas spaced apart from each other, wherein
the bridge electrode and the opposite electrodes of the two immediately adjacent pixels are together made of a single, continuous electrode,
a thickness of the bridge electrode varies between the opposite electrodes electrically connected to each other by the bridge electrode with each other,
the thickness of the bridge electrode varies in an area where a bottom surface of the bridge electrode makes direct contact with an electrically insulating layer, and
the thickness of the bridge electrode varies such that a top surface of the bridge electrode forms an alternating concave-convex pattern while a bottom surface of the bridge electrode directly below the alternating concave-convex pattern is flat.

17. The display apparatus of claim 1, wherein
the first pixel area is immediately adjacent to the transmission area along a first direction,
the second pixel area is immediately adjacent to the transmission area along a second direction perpendicular to the first direction, and
the bridge electrode electrically extends along a direction diagonal to the first direction.

* * * * *